United States Patent
Okazaki et al.

(10) Patent No.: US 7,068,690 B2
(45) Date of Patent: Jun. 27, 2006

(54) MULTIPLEX LASER-LIGHT SOURCE AND EXPOSURE SYSTEM

(75) Inventors: Yoji Okazaki, Kaisei-machi (JP);
Kazuhiko Nagano, Kaisei-machi (JP);
Teruhiko Kuramachi, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 302 days.

(21) Appl. No.: 10/615,937

(22) Filed: Jul. 10, 2003

(65) Prior Publication Data
US 2004/0008744 A1    Jan. 15, 2004

(30) Foreign Application Priority Data
Jul. 10, 2002    (JP)    ............. 2002-201904

(51) Int. Cl.
*H01S 3/04*    (2006.01)
(52) U.S. Cl. ........................................ 372/36
(58) Field of Classification Search ............. 372/50.12
See application file for complete search history.

(56) References Cited

U.S. PATENT DOCUMENTS

| | | | |
|---|---|---|---|
| 5,337,325 A * | 8/1994 | Hwang | 372/36 |
| 5,432,535 A * | 7/1995 | Andrews et al. | 347/242 |
| 5,640,188 A * | 6/1997 | Andrews | 347/130 |
| 5,761,234 A * | 6/1998 | Craig et al. | 372/75 |
| 6,240,116 B1 * | 5/2001 | Lang et al. | 372/50.12 |
| 6,479,325 B1 * | 11/2002 | Ozawa | 438/119 |
| 6,718,088 B1 * | 4/2004 | Okazaki et al. | 385/27 |
| 2002/0018499 A1 * | 2/2002 | Kuniyasu et al. | 372/36 |

OTHER PUBLICATIONS

Japanese Journal of Applied Physics Part 2 Letters, vol. 37, 1998, pp. L1020-1022.

* cited by examiner

*Primary Examiner*—Minsun Oh Harvey
*Assistant Examiner*—Tod T. Van Roy
(74) *Attorney, Agent, or Firm*—Sughrue Mion, PLLC

(57) ABSTRACT

In a laser-light source: submounts each being made of a material having a thermal expansion coefficient of 3.5 to $6.0\times10^{-6}/°$ C. and having a thickness of 200 to 400 micrometers are separately formed on a heat-dissipation block made of copper or copper alloy; a single-cavity nitride-based semiconductor laser chips are respectively mounted junction-side-down on the corresponding submounts; an optical condenser system collects laser beams emitted from the semiconductor laser chips, and couples the collected laser beams to a multimode optical fiber. A bonding surface of each semiconductor laser chip is bonded to a bonding surface of a corresponding submount through a metalization layer and an Au—Sn eutectic solder layer each of which is divided into areas.

22 Claims, 16 Drawing Sheets

410'

410'

DIRECTION OF WIND PRODUCED BY COOLING BLOWER 160 ness of 200 to 400 micrometers, and are separately formed
MULTIPLEX LASER-LIGHT SOURCE AND EXPOSURE SYSTEM

BACKGROUND OF THE INVENTION

1. Field of the Invention

The present invention relates to a laser-light source which uses optical fibers and optically multiplexes a plurality of laser beams emitted from a plurality of semiconductor lasers.

The present invention also relates to an exposure system which uses the above laser-light source as a light source for exposure.

2. Description of the Related Art

Conventionally, in order to generate a laser beam having a ultraviolet wavelength, wavelength conversion lasers, excimer lasers, and Ar lasers have been used in practice. In the wavelength conversion lasers, infrared light emitted from a solid-state laser excited with a semiconductor laser is converted into a third harmonic having an ultraviolet wavelength.

Further, recently, GaN-based compound semiconductor lasers which emit a laser beam having a wavelength in the vicinity of 400 nm have been provided, for example, as disclosed in Japanese Journal of Applied Physics Part 2 Letters, vol. 37, 1998, pp. L1020.

Light sources which emit laser beams having the wavelengths as mentioned above are being considered for use in exposure systems for exposure of photosensitive materials which are sensitive to light in a predetermined wavelength range including an ultraviolet wavelength range of 350 to 420 nm. In such a case, the light sources for exposure are required to have sufficient output power for exposing the photosensitive materials. The above predetermined wavelength range is hereinafter referred to as the ultraviolet range.

However, the excimer lasers are large in size, and the manufacturing costs and maintenance costs of the excimer lasers are high.

In the wavelength conversion lasers which convert infrared light into a third harmonic in the ultraviolet range, the wavelength conversion efficiency is very low. Therefore, it is very difficult to achieve high output power. In a typical wavelength conversion laser at the currently practical level, a solid-state laser medium is excited with a semiconductor laser having an output power of 30 W so as to output a fundamental harmonic having a wavelength of 1,064 nm and an output power of 10 W, the fundamental harmonic is converted into a second harmonic having a wavelength of 532 nm and an output power of 3 W, and a third harmonic having a wavelength of 355 nm (i.e., a sum frequency of the first and second harmonics) and an output power of 1 W is obtained. In this wavelength conversion laser, the efficiency in electric-to-optical conversion in the semiconductor laser is about 50%, and the efficiency in conversion to the ultraviolet light is as low as about 1.7%. In addition, since an optical wavelength conversion element, which is expensive, is used in the above wavelength conversion laser, the manufacturing cost of the wavelength conversion laser is high.

Further, the efficiency in electric-to-optical conversion in the Ar lasers is as low as 0.005%, and the lifetime is as short as about 1,000 hours.

On the other hand, since it is difficult to obtain a low-dislocation GaN crystal substrate, an attempt has been made to achieve high output power and reliability in a GaN-based compound semiconductor laser. In the attempt, a low-dislocation region having a width of about 5 micrometers is produced by a growth method called ELOG (epitaxial lateral overgrowth), and a laser region is formed on the low-dislocation region. However, even in this attempt, it is difficult to obtain a low-dislocation substrate having a large area. Therefore, no GaN-based compound semiconductor laser having a high output power of 500 mW to 1 W has yet been commercialized.

In another attempt which is being considered for increasing output power of a semiconductor laser, for example, a hundred cavities each of which outputs light with an output power of 100 mW are formed so as to obtain a total output power of 10 W. However, it is almost unrealistic to manufacture as many as a hundred cavities with high yield. In particular, it is difficult to manufacture GaN-based compound semiconductor lasers each having many cavities since manufacture of GaN-based compound semiconductor lasers with a high yield of 99% or greater is difficult even in the case of single-cavity GaN-based compound semiconductor lasers.

SUMMARY OF THE INVENTION

An object of the present invention is to provide a laser-light source which can be produced at low cost, and can achieve high output power.

Another object of the present invention is to provide an exposure system which is constructed by using a laser-light source, and can expose a photosensitive material to laser light having high intensity, where the laser-light source can be produced at low cost, and can achieve high output power.

(I) According to the first aspect of the present invention, there is provided a laser-light source comprising: a heat-dissipation block made of copper or copper alloy; a plurality of submounts which are made of a material having a thermal expansion coefficient of 3.5 to $6.0 \times 10^{-6}/^\circ$ C., have a thickness of 200 to 400 micrometers, and are separately formed on the heat-dissipation block; a plurality of semiconductor lasers each of which is made of a nitride compound, has a single cavity and a form of a chip, and is mounted junction-side-down on one of the plurality of submounts; a multimode optical fiber; and an optical condenser system which collects laser beams emitted from the plurality of semiconductor lasers, and couples the collected laser beams to the multimode optical fiber. Each of the plurality of semiconductor lasers and the plurality of submounts has a bonding surface, and the bonding surface of each of the plurality of semiconductor lasers is bonded to the bonding surface of one of the plurality of submounts through a metalization layer and an Au—Sn eutectic solder layer each of which is divided into a plurality of areas.

The laser-light source according to the first aspect of the present invention has the following advantages (a) to (g).

(a) In the laser-light source according to the first aspect of the present invention, the plurality of laser beams emitted from the plurality of semiconductor lasers are collected and coupled to the multimode optical fiber by the optical condenser system. Therefore, the construction of the laser-light source according to the first aspect of the present invention is very simple. In addition, no constituent which is difficult to produce is used. Thus, the laser-light source according to the first aspect of the present invention can be produced at low cost.

(b) In addition, the heat-dissipation block in the laser-light source according to the first aspect of the present invention is made of one of copper and copper alloy, which are inexpensive and exhibit high heat conductivity. Therefore, it is possible to effectively dissipate heat generated by the plurality of semiconductor lasers, and produce the laser-light source at low cost.

(c) When each semiconductor laser is fixed on a submount in a junction-side-down structure, the light emission region of the semiconductor laser is located nearer to the submount and the heat-dissipation block, and therefore heat is dissipated more effectively, in comparison with the case where the substrate-side of the semiconductor laser is bonded to the submount.

(d) The thickness of each submount can be more easily adjusted than the thickness of each chip substrate. Therefore, when the precision of the thicknesses of the submounts is controlled to be one micrometer or smaller, and the semiconductor laser chips are mounted junction-side-down, variations in the heights of the light emission points in the respective semiconductor laser chips can be suppressed, and therefore high-efficiency coupling to the optical fiber is realized.

(e) The semiconductor laser chips are bonded to the submounts with the Au—Sn eutectic solder, and the Au—Sn eutectic solder is superior in characteristics relating to locational variations with elapse of time. Therefore, in the laser-light source according to the first aspect of the present invention, the variations of the locations of the light emission points with elapse of time can be effectively suppressed.

(f) The submounts are made of a material having a thermal expansion coefficient of 3.5 to $6.0 \times 10^{-6}/°$ C., and have a thickness of 200 to 400 micrometers. Therefore, it is possible to prevent deterioration of the semiconductor lasers which can be caused by thermal strain generated by solder bonding, for the reason explained later in relation to an embodiment of the present invention.

(g) Since the Au—Sn eutectic solder layer is divided into a plurality of areas between bonding surfaces of each submount and a corresponding semiconductor laser, it is possible to limit stress occurring around bonded areas, to a small amount.

(II) Preferably, the laser-light source according to the first aspect of the present invention may also have one or any possible combination of the following additional features (i) to (xii).

(i) Each of the plurality of semiconductor lasers contains a light emission region, and the metalization layer and the Au—Sn eutectic solder layer are separated by a groove which is arranged immediately below the light emission region.

(ii) The plurality of submounts are made of AlN. The use of AlN in the plurality of submounts is particularly preferable when each of the plurality of semiconductor lasers is a GaN-based compound semiconductor laser.

(iii) The plurality of submounts are bonded to the heat-dissipation block with Au—Sn eutectic solder.

(iv) The plurality of semiconductor lasers respectively contain active layers and light emission points, the light emission points of the plurality of semiconductor lasers are arranged on a line parallel to the active layers, the optical condenser system includes a plurality of collimator lenses and a condenser lens, the plurality of collimator lenses are arranged in correspondence with the plurality of semiconductor lasers and respectively collimate the laser beams emitted from the plurality of semiconductor lasers, the condenser lens collects the laser beams collimated by the plurality of collimator lenses, and makes the collimated laser beams converge on an end face of the multimode optical fiber, and the plurality of collimator lenses each have an aperture which has a first diameter parallel to the line and a second diameter perpendicular to the line and greater than the first diameter.

In this case, it is possible to reduce the pitch with which the plurality of semiconductor lasers are arranged. That is, arrangement with higher density is enabled. When the plurality of semiconductor lasers are arranged with high density as above, the misalignment of the plurality of laser beams at the end face of the multimode optical fiber can be limited to a smaller amount. Therefore, it is possible to relax requirements for alignment precision in assembly of the plurality of semiconductor lasers, the optical condenser system, and the multimode optical fiber. Further, since the alignment precision in the assembly can be relaxed as above, it is possible to increase the number of optically multiplexed laser beams and the output power for the reason explained later.

(v) In the laser-light source having the feature (iv), the plurality of collimator lenses are integrally formed into a lens array.

In this case, it is possible to prevent occurrence of wide noneffective space in the vicinities of the respective collimator lenses, although wide noneffective space occurs in the case where a plurality of collimator lenses are separately formed. Therefore, when the plurality of collimator lenses are integrally formed into a lens array, the plurality of collimator lenses can be arranged more closely, i.e., with higher density. Thus, the effect of relaxing the alignment precision in the assembly and the effect of increasing the number of optically multiplexed laser beams and output power are further enhanced.

In addition, the positions of the plurality of collimator lenses can be adjusted by only the adjustment of the single lens array. That is, the operation for position adjustment is simplified.

(vi) The heat-dissipation block is constituted by a plurality of blocks which are joined (or bonded together).

In this case, it is possible to increase the mounting yield of the semiconductor lasers in comparison with the case where all of the semiconductor lasers are mounted on a single block. For example, in the case where the mounting yield of a single semiconductor laser is 98%, the total mounting yield in the case where six semiconductor lasers are mounted on a single block is 89% ($=0.98^6 \times 100$). On the other hand, the total mounting yield in the case where three semiconductor lasers are mounted on each of two blocks becomes 94% ($=0.98^3 \times 100$) since almost 100% yield is realized in the step of joining the two blocks.

(vii) Each of the plurality of semiconductor lasers is a GaN-based compound semiconductor laser.

(viii) The multimode optical fiber has a core diameter not greater than 50 micrometers and a numerical aperture not greater than 0.3.

In the fields of printing, medical imaging, formation of images for PCB's (printed circuit boards), PDP's (plasma display panels), LCD's (liquid crystal displays) in photosensitive materials by exposure, and the like, when the core diameter of the multimode optical fiber is not greater than 50 micrometers, it is possible to make the exposure spot very small and realize highly fine image exposure. In addition, when the numerical aperture of the multimode optical fiber is not greater than 0.3, it is possible to achieve a sufficient focal depth for the highly fine image exposure, i.e., to expose highly sharp images.

(ix) The multimode optical fiber has a core diameter and a numerical aperture, and the core diameter multiplied by the numerical aperture is not greater than 7.5 micrometers.

In the case where the core diameter multiplied by the numerical aperture is not greater than 10 micrometers, possible combinations of the core diameter and the numerical aperture are, for example, 50 μm×0.2, 40 μm×0.25, 30 μm×0.3, and 25 μm×0.3, since it is difficult to produce optical fibers when the numerical aperture of the optical fiber exceeds 0.3. When a multimode optical fiber in which the core diameter multiplied by the numerical aperture is not greater than 10 micrometers is used, the plurality of laser beams emitted from the plurality of semiconductor lasers can be collimated by the plurality of collimator lenses having a numerical aperture equivalent to the numerical aperture of the multimode optical fiber, and the collimated laser beams can be collected in a spot not greater than 25 micrometers by the condenser lens having a numerical aperture of 0.3. Therefore, it is possible to achieve high resolution and a sufficient focal depth.

(x) The plurality of semiconductor lasers are arranged on a line, and the number of the plurality of semiconductor lasers is three to ten, and more preferably six or seven.

According to the polarization multiplex, which is conventionally known, laser beams emitted from only two semiconductor lasers can be optically multiplexed. On the other hand, when the number of the semiconductor lasers arranged in the laser-light source according to the first aspect of the present invention is three or greater, it is possible to obtain an optically multiplexed laser beam with higher output power than the optically multiplexed laser beams which are conventionally obtained. However, currently, the yield in the step of mounting a semiconductor laser is about 98%. When the yield in the step of mounting a semiconductor laser is 98%, the yield in the step of mounting ten semiconductor lasers is as low as 82%. Practically, a yield lower than 82% is not preferable. Therefore, based on the current yield in the step of mounting a semiconductor laser, the preferable upper limit of the number of the semiconductor lasers arranged in the laser-light source according to the first aspect of the present invention is determined to be ten.

In the case where the multimode optical fiber having a core diameter not greater than 50 micrometers and a numerical aperture not greater than 0.3 or the multimode optical fiber in which the core diameter multiplied by the numerical aperture is not greater than 10 micrometers is used for image formation, and ten semiconductor lasers are arranged on a line, a mounting precision less than 0.1 micrometers is required. However, when the number of the semiconductor lasers arranged on a line is limited to six or seven, the requirement for the mounting precision is remarkably relaxed and becomes 0.3 to 1.0 micrometers. In addition, when the number of the semiconductor lasers is six or seven, the output power is doubled compared with the case of three semiconductor lasers.

(xi) Each of the plurality of semiconductor lasers has an emission width of 1.5 to 5 micrometers, and more preferably 2 to 3 micrometers.

For example, in the case of a GaN-based compound semiconductor laser, when each of the plurality of semiconductor lasers has an emission width of 1.5 micrometers or greater, the output power of each semiconductor laser (50 mW or greater) is higher than the maximum output power (about 30 mW) in a completely single transverse mode. On the other hand, in the case where the multimode optical fiber having a core diameter not greater than 50 micrometers and a numerical aperture not greater than 0.3 or the multimode optical fiber in which the core diameter multiplied by the numerical aperture is not greater than 10 micrometers is used for image formation, and each of the plurality of semiconductor lasers has an emission width of 5 micrometers or smaller, it is possible to construct an optical condenser coupling system corresponding to three or more semiconductor lasers. In particular, in the case where the above multimode optical fiber is used, and each of the plurality of semiconductor lasers has an emission width of 2 to 3 micrometers, it is possible to construct an optical condenser coupling system corresponding to six or seven semiconductor lasers.

(xii) The plurality of semiconductor lasers are fixed so that the plurality of semiconductor lasers are two-dimensionally arranged when viewed from a laser-receiving side.

In this case, a great number of semiconductor lasers can be arranged with high density. Therefore, it is possible to make a great number of laser beams enter a single multimode optical fiber (i.e., to increase optical input power to the multimode optical fiber), and obtain an optically multiplexed laser beam with higher output power.

(III) According to the second aspect of the present invention, there is provided a laser-light source which comprises a plurality of laser-light-source portions each having a construction identical to the laser-light source according to the first aspect of the present invention. In addition, the multimode optical fibers in the plurality of laser-light-source portions are arranged to form a one-dimensional array or a bundle at least at light-emission ends of the multimode optical fibers.

In this case, a plurality of high-power laser beams arranged in a one-dimensional array or a bundle can be emitted from the multimode optical fibers in the plurality of laser-light-source portions. Therefore, it is possible to make each of the plurality of high-power laser beams enter one of modulation portions constituting a spatial light modulation element such as a GLV or DMD and being one or two-dimensionally arranged, and perform efficient modulation for image exposure or the like.

(IV) According to the third aspect of the present invention, there is provided an exposure system which comprises, as light sources for exposure, a laser-light source having a construction identical to the laser-light source according to the second aspect of the present invention.

In the exposure system according to the third aspect of the present invention, it is possible to form a two-dimensional image on a photosensitive material by exposing the photosensitive material to laser beams which are emitted from a two-dimensionally arranged semiconductor lasers and modulated by the aforementioned spatial light modulation element, or by exposing a photosensitive material to laser beams which are emitted from a one or two-dimensionally arranged semiconductor lasers while moving the photosensitive material relative to the laser beams so as to feed the photosensitive material.

DESCRIPTION OF PREFERRED EMBODIMENTS

Embodiments of the present invention are explained in detail below with reference to the drawings.

First Embodiment

Figure 1:
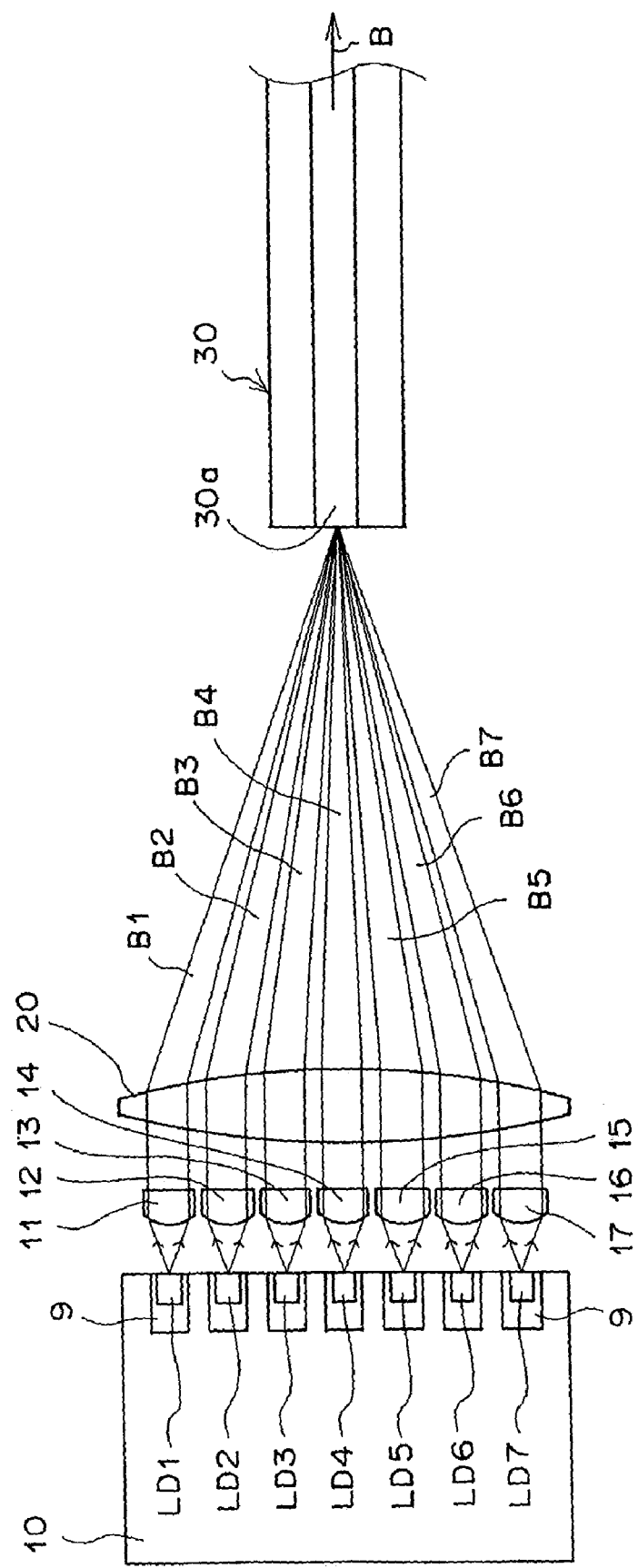
FIG. 1 is a plan view of a laser-light source as a first embodiment of the present invention.

FIG. 1 is a plan view of a laser-light source according to the first embodiment of the present invention. As illustrated in FIG. 1, the laser-light source of FIG. 1 comprises GaN-based semiconductor laser chips LD1 to LD7, collimator lenses 11 to 17, a condenser lens 20, and a multimode optical fiber 30. Each of the GaN-based semiconductor laser chips LD1 to LD7 has a single cavity and a form of a chip, and operates in a single transverse mode. The GaN-based semiconductor laser chips LD1 to LD7 are arranged and fixed on a heat block 10 (heat-dissipation block) made of copper, where submounts 9 are placed between the GaN-based semiconductor laser chips LD1 to LD7 and the heat block 10. Hereinafter, the heat block 10 is also referred to as the Cu heat-dissipation block. The collimator lenses 11 to 17 are respectively arranged in correspondence with the GaN-based semiconductor laser chips LD1 to LD7.

Note that FIG. 1 shows only an outline of the construction of the laser-light source according to the first embodiment. The shapes of the collimator lenses 11 to 17 and the condenser lens 20 are schematically shown in FIG. 1, and details of the mounting of the collimator lenses 11 to 17 and the condenser lens 20 will be explained later.

Figure 2:
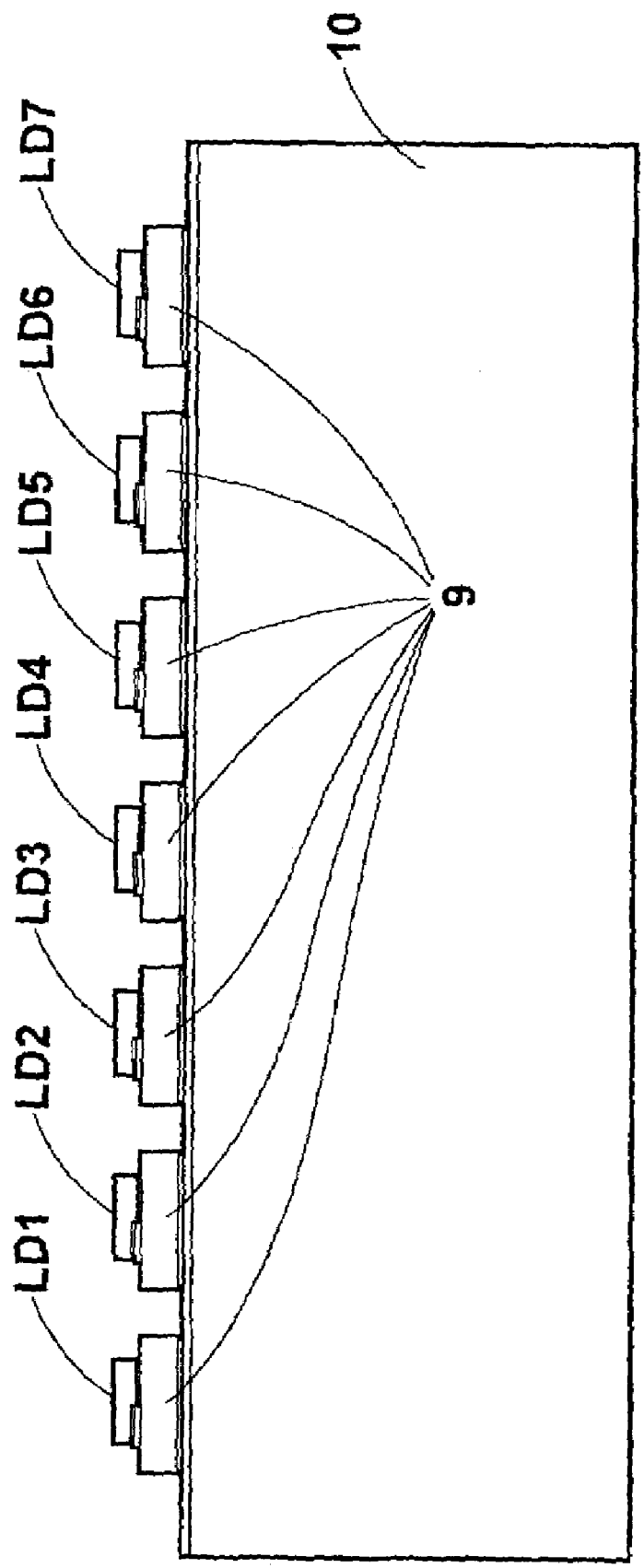
FIG. 2 is a front view of a portion of the laser-light source of FIG. 1, where the portion contains semiconductor lasers.

Note that FIG. 1 shows the basic construction of the multiplex laser light source of the present embodiment. The shapes of the collimating lenses 11 through 17 and the condensing lens 20 are schematically shown. The details of the mounting states thereof will be described later. Note that the mounting states of the submount 9 corresponding to the heat block 10, as well as the GaN semiconductor laser chips LD1 through LD7 are shown in FIG. 2. The mounting of the GaN semiconductor laser chips LD1 through LD7 will be described in detail later.

The GaN-based semiconductor laser chips LD1 to LD7 each have an identical oscillation wavelength of 405 nm and an identical maximum output power of 30 mW. Divergent laser beams B1 to B7 emitted from the GaN-based semiconductor laser chips LD1 to LD7 are respectively collimated by the collimator lenses 11 to 17. Then, the collimated laser beams B1 to B7 are collected by the condenser lens 20, and converge on an entrance end face of the core 30a of the multimode optical fiber 30. In this example, an optical condenser system is constituted by the collimator lenses 11 to 17 and the condenser lens 20, and an optical multiplex system is constituted by the optical condenser system and the multimode optical fiber 30. Thus, the laser beams B1 to B7 collected by the condenser lens 20 as above enter and propagate in the core 30a of the multimode optical fiber 30, in which the laser beams B1 to B7 are optically multiplexed into a single laser beam B. Then, the laser beam B is output from the multimode optical fiber 30. The multimode optical fiber 30 may be a step-index type, a step-index type, or any combination thereof.

Figure 3:
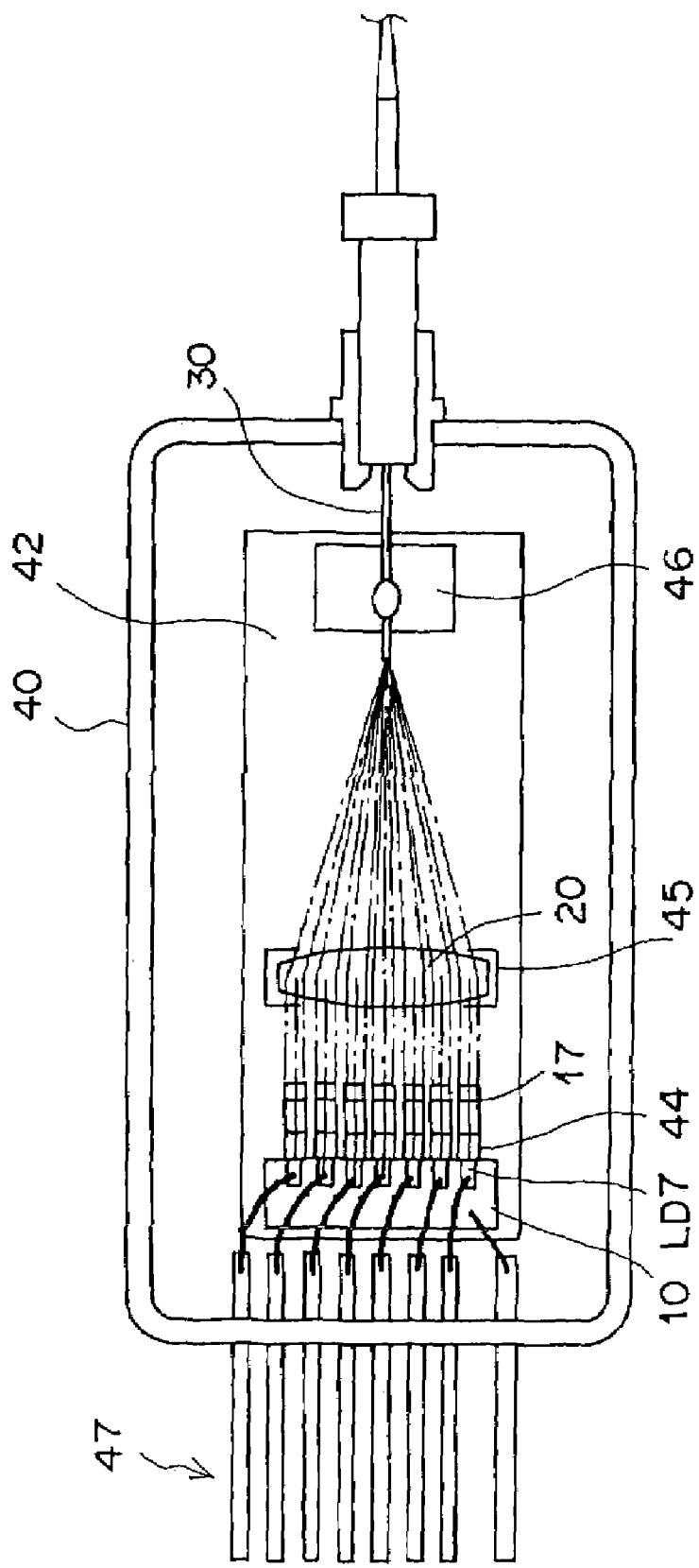
FIG. 3 is a plan view of a high-intensity ultraviolet-light optically-multiplexing fiber module comprising the laser-light source of FIG. 1.
Figure 4:
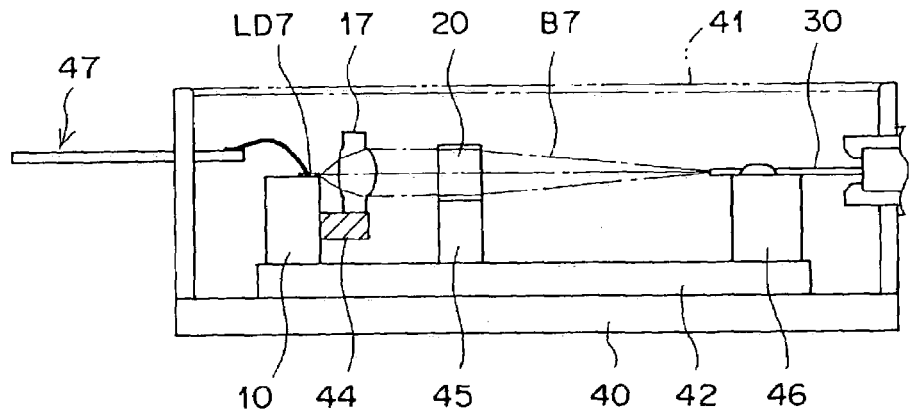
FIG. 4 is a side view of the high-intensity ultraviolet-light optically-multiplexing fiber module of FIG. 3.
Figure 5:
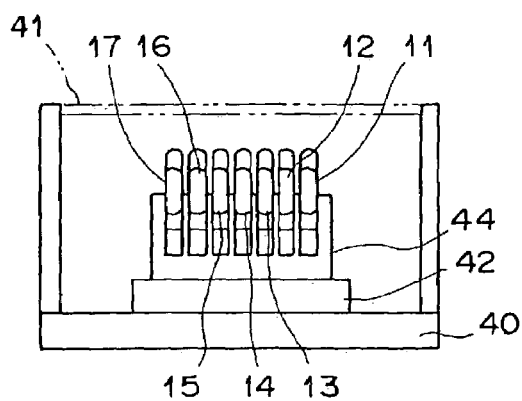
FIG. 5 is a partial front view of the high-intensity ultraviolet-light optically-multiplexing fiber module of FIG. 3.

Next, a high-intensity ultraviolet-light optically-multiplexing fiber module constituted by the laser-light source illustrated in FIG. 1 is explained in detail. FIGS. 3, 4 and 5 are plan, side, and partial front views of a high-intensity ultraviolet-light optically-multiplexing fiber module. In FIGS. 3, 4 and 5, details of the shapes and the mounting of the collimator lenses 11 to 17 and the condenser lens 20 are shown. In FIG. 3, in order to simplify the illustration, the reference numbers of the GaN-based semiconductor laser chips LD1 to LD6 and the collimator lenses 11 to 16 are not shown.

In this example, the optical elements constituting the high-intensity ultraviolet-light optically-multiplexing fiber module are contained in a box type package 40, which has an opening on its upper side. By closing the opening with a cover 41, the high-intensity ultraviolet-light optically-multiplexing fiber module is hermetically sealed and held within the closed space realized by the package 40 and the cover 41.

A base plate 42 is fixed on the inner bottom surface of the package 40, the aforementioned heat block 10 is fixed on the upper surface of the base plate 42, and a collimator-lens holder 44 for holding the collimator lenses 11 to 17 is fixed to the heat block 10. In addition, a condenser-lens holder 45 for holding the condenser lens 20 and a fiber holder 46 for holding the entrance end of the multimode optical fiber 30 are fixed on the upper surface of the base plate 42. Further, wirings 47 for supplying driving currents to the GaN-based semiconductor laser chips LD1 to LD7 are led out of the package 40 through openings formed in a sidewall of the package 40.

Figure 6A:
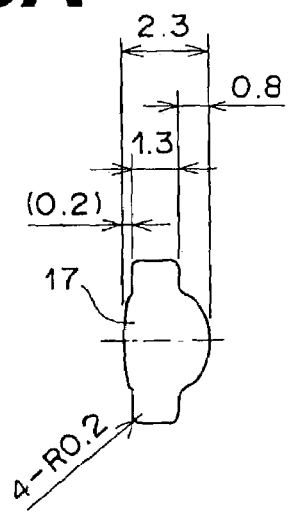
FIG. 6A is a side view of a collimator lens used in the laser-light source of FIG. 1.
Figure 6B:
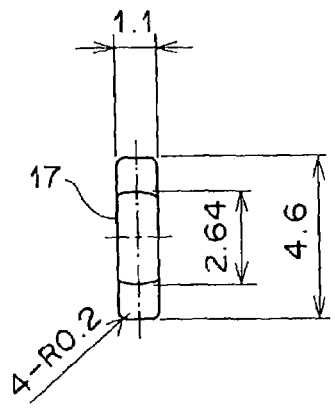
FIG. 6B is a front view of the collimator lens used in the laser-light source of FIG. 1.

FIG. 5 is a partial front view of the high-intensity ultraviolet-light optically-multiplexing fiber module of FIG. 3. Each of the collimator lenses 11 to 17 has an elongated shape which is obtained by cutting an aspherical round lens so as to leave a portion containing the optical axis of the aspherical round lens. For example, the collimator lenses 11 to 17 can be formed by molding from resin or optical glass. FIGS. 6A and 6B are magnified side and front views of the collimator lens 17 as a representative of the collimator lenses 11 to 17 used in the optically-multiplexing fiber module of FIG. 3. In addition, examples of dimensions (in millimeters) of the essential portions are indicated in FIGS. 6A and 6B.

The collimator lenses 11 to 17 illustrated in FIGS. 5, 6A and 6B has an aperture which has a first diameter parallel to the direction in which light emission points of the GaN-based semiconductor laser chips LD1 to LD7 are arranged (i.e., the horizontal direction in FIG. 5) and a second diameter in the direction (i.e., the vertical direction in FIG. 5) perpendicular to the first diameter and greater than the first diameter. The collimator lenses 11 to 17 are arranged close to each other in the direction in which light emission points of the GaN-based semiconductor laser chips LD1 to LD7 are arranged.

For example, each of the GaN-based semiconductor laser chips LD1 to LD7 has an emission width of about one micrometer, a spread angle of 10 degrees in the minor axis direction parallel to the active layer of the GaN-based semiconductor laser chip and a spread angle of 30 degrees in the major axis direction perpendicular to the active layer. In addition, the light emission points of the GaN-based semiconductor laser chips LD1 to LD7 are arranged on a line parallel to the active layers of the GaN-based semiconductor laser chips LD1 to LD7.

The laser beams B1 to B7 respectively enter the collimator lenses 11 to 17 in such a manner that the direction in which the spread angle of each of the laser beams B1 to B7 is maximized coincides with the direction of the greater diameter of the elongated aperture of each of the collimator lenses 11 to 17, and the direction in which the spread angle of each of the laser beams B1 to B7 is minimized coincides with the direction of the smaller diameter of the elongated aperture of each of the collimator lenses 11 to 17. Since the elliptic cross sections of the incident laser beams B1 to B7 fit well with the elongated shapes of the collimator lenses 11 to 17, it is possible to minimize portions of the apertures of the collimator lenses 11 to 17 which are not effectively used. In other words, the collimator lenses 11 to 17 can be efficiently used.

Specifically, in the first embodiment, the aperture diameters of each of the collimator lenses 11 to 17 in the horizontal and vertical directions are respectively 1.1 mm and 4.6 mm, and the beam diameters of each of the incident laser beams B1 to B7 in the horizontal and vertical directions are respectively 0.9 mm and 2.6 mm. In addition, the collimator lenses 11 to 17 each have a focal length $f_1$ of 3 mm and a numerical aperture (NA) of 0.6, and are arranged with a lens pitch of 1.25 mm.

Figure 7A:
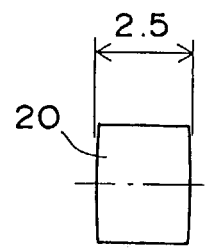
FIG. 7A is a side view of a condenser lens used in the laser-light source of FIG. 1.
Figure 7B:
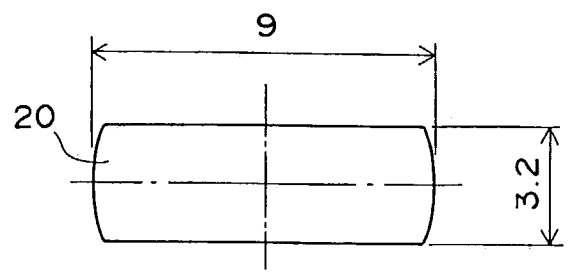
FIG. 7B is a front view of the condenser lens used in the laser-light source of FIG. 1.

FIGS. 7A and 7B are magnified side and front views of the condenser lens 20. In addition, examples of dimensions (in millimeters) of the essential portions are indicated in FIGS. 7A and 7B. As illustrated in FIGS. 7A and 7B, the condenser lens 20 also has an elongated shape which is obtained by cutting an aspherical round lens so as to leave a portion containing the optical axis of the aspherical round lens. The condenser lens 20 is elongated in a horizontal direction along which the collimator lenses 11 to 17 are arranged, and is short in the vertical direction. In this example, the condenser lens 20 has a focal length $f_2$ of 23 mm and a numerical aperture (NA) of 0.2. For example, the condenser lens 20 can also be formed by molding from resin or optical glass.

On the other hand, the multimode optical fiber 30 is formed by using a step-index type optical fiber manufactured by Mitsubishi Cable Industries, Ltd. as its base. The multimode optical fiber 30 has a core diameter of 50 micrometers and a numerical aperture (NA) of 0.2, and the transmittance of the end face coating is 99.5% or greater. In this example, the core diameter multiplied by the NA is 10 micrometers.

In the construction of the first embodiment, the coupling efficiency of the laser beams B1 to B7 to the multimode optical fiber 30 is 0.9. Therefore, when the output power of each of the GaN-based semiconductor laser chips LD1 to LD7 is 30 mW, the output power of the optically multiplexed laser beam B becomes 190 mW(=30 mW×0.9×7).

Figure 8:
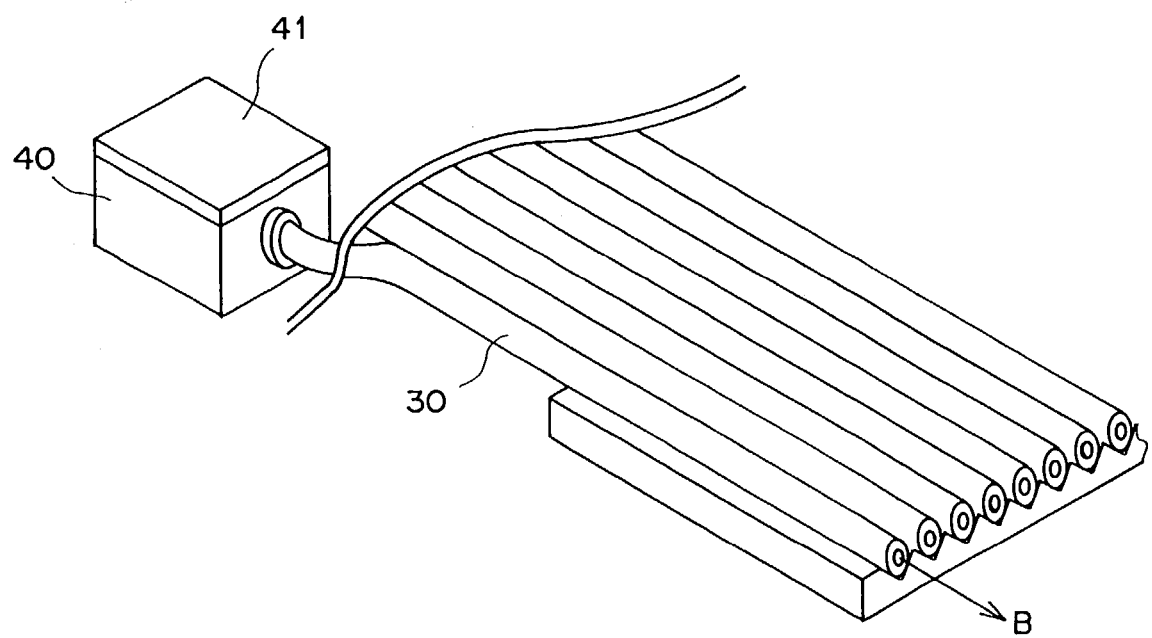
FIG. 8 is a plan view of a light-source apparatus comprising a plurality of laser-light-source portions each of which is identical to FIG. 1.

As illustrated in FIG. 8, it is possible to arrange in a one-dimensional array light emission ends of a plurality of multimode optical fibers each having an identical construction to the above multimode optical fiber 30, and form a light source which emits a high-intensity ultraviolet-light laser beam B from each of the plurality of multimode optical fibers. Specifically, when 53 multimode optical fibers each of which emits an optically multiplexed laser beam B with an output power of 190 mW are arranged, it is possible to realize an extremely high total output power of 10 W and a high optical density of 1.5 W/mm(=10 W/(125 μm×53)). At this time, it is possible to achieve energy efficiency as high as about 15%, which is equivalent to the emission efficiency of the GaN-based compound semiconductor lasers. Further, when semiconductor lasers each of which operates in multiple transverse modes with an output power of 100 mW are used instead of the GaN-based semiconductor laser chips LD1 to LD7 in the construction of the first embodiment, it is possible to achieve a fiber output power of 630 mW and a high optical density of 5 W/mm(=10 W/(125 μm×16)).

Alternatively, it is possible to form a light source by arranging light emission ends of a plurality of multimode optical fibers in a bundle. Preferably, such a light source can be used in an image exposure system in combination with a one or two-dimensional spatial light modulation element. Such an image exposure system is explained later in detail.

Figure 9:
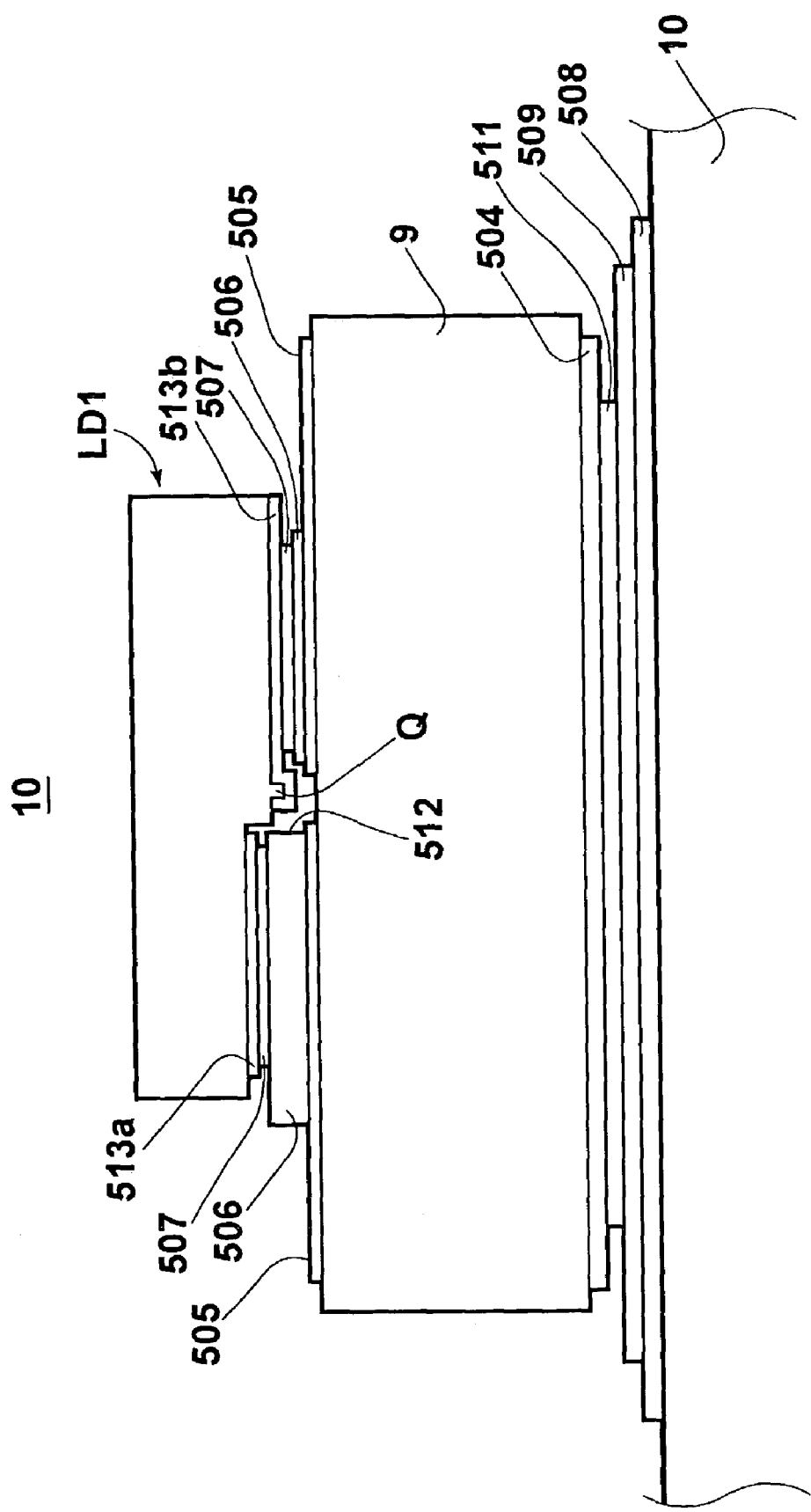
FIG. 9 is a front view of a structure for mounting a GaN-based semiconductor laser chip in the laser-light source of FIG. 1.

Next, the mounting of the GaN-based semiconductor laser chips LD1 to LD7 by using the submounts 9 will be explained in detail below. FIG. 9 is a front view of a structure for mounting the GaN-based semiconductor laser chip LD1 on the heat-dissipation block 10. Although only the mounting of the GaN-based semiconductor laser chip LD1 is explained, the other GaN-based semiconductor laser chips LD2 to LD7 are mounted in similar manners to the GaN-based semiconductor laser chip LD1.

Figure 10:
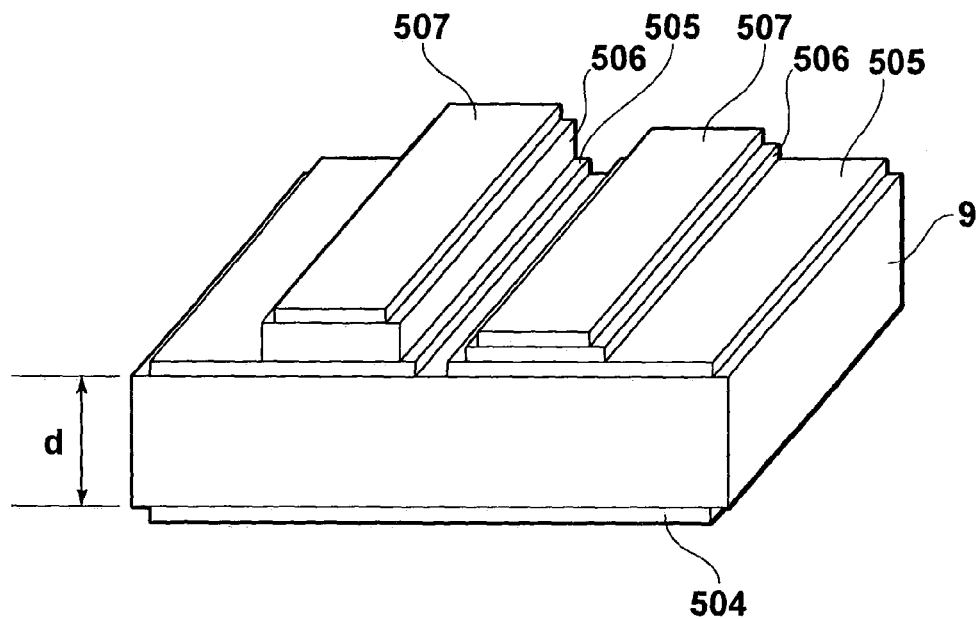
FIG. 10 is a perspective view of a portion of a structure for mounting a GaN-based semiconductor laser chip in the laser-light source of FIG. 1.

First, as illustrated in FIG. 9, and Au/Pt/Ti metalization layer 504 is formed on the bottom surface of a submount 9, which is made of AlN. Then, an Au/Ni plating layer 505 and an Au/Pt/Ti metalization layer 506 are formed on the top surface of the submount 9. The Au/Pt/Ti metalization layer 506 includes areas having greater and smaller thicknesses (having higher and lower surfaces), i.e., the top side of the Au/Pt/Ti metalization layer has a steplike shape. In this specification, the thickness d of the submount 9 does not include the above metalization or plating layers 504 to 506 as illustrated in FIG. 10.

The steplike shape of the Au/Pt/Ti metalization layer 506 can be formed by forming a uniform Au/Pt/Ti metalization layer having the greater thickness, and removing portions of the uniform Au/Pt/Ti metalization layer corresponding to the areas which are to have the smaller thickness by a dry process such as ion milling or a wet process using an etchant. Alternatively, the steplike shape of the Au/Pt/Ti metalization layer 506 can be formed by forming a uniform Au/Pt/Ti metalization layer having the smaller thickness, masking the areas which are to have the smaller thickness, and additionally metalizing the areas which are to have the greater thickness.

Next, Au—Sn eutectic solder pads 507 are arranged on one of the lower surfaces and the higher surface of the Au/Pt/Ti metalization layer 506. For example, the Au—Sn eutectic solder pads 507 each have a size of 150×500 micrometers, and separated from each other by 10 micrometers.

For example, the size of the GaN-based semiconductor laser chip LD1 is 400×600×100 micrometers, and the GaN-based semiconductor laser chip LD1 is placed on the Au—Sn eutectic solder pads 507, and bonded to the submount 9 by heating the Au—Sn eutectic solder pads 507 to 330° C. and melting the Au—Sn eutectic solder pads 507.

On the other hand, an Au/Ni plating layer 508 and an Au/Pt/Ti metalization layer 509 are formed on the Cu heat-dissipation block 10, and an Au—Sn eutectic solder layer 511 is formed on the Au/Pt/Ti metalization layer 509. Then, the submount 9 is placed on the Au—Sn eutectic solder layer 511 with the Au/Pt/Ti metalization layer 504 down, and the submount 9 is bonded to the Cu heat-dissipation block 10 by heating the Au—Sn eutectic solder layer 511 to 310° C. and melting the Au—Sn eutectic solder layer 511. Thus, the submount 9 is mounted on the Cu heat-dissipation block 10 through the submount 9.

The melting point of the Au—Sn solder varies with the Au/Sn composition. Therefore, it is possible to make a difference in the melting point between the Au—Sn eutectic solder pads 507 and the Au—Sn eutectic solder layer 511 after the Au—Sn eutectic solder pads 507 and the Au—Sn eutectic solder layer 511 are molten, by making the Au composition of each of the Au—Sn eutectic solder pads 507 and the Au—Sn eutectic solder layer 511 several percent higher than the eutectic composition. The Au compositions of the Au—Sn eutectic solder pads 507 and the Au—Sn eutectic solder layer 511 can be appropriately increased by independently controlling the thicknesses of the Au/Pt/Ti metalization layer 506 and the Au/Pt/Ti metalization layer 504 and the temperatures of the Au—Sn eutectic solder pads 507 and the Au—Sn eutectic solder layer 511 when the Au—Sn eutectic solder pads 507 and the Au—Sn eutectic solder layer 511 are molten.

In the case where a difference in the melting point is made as above between the Au—Sn eutectic solder pads 507 and the Au—Sn eutectic solder layer 511 after the Au—Sn eutectic solder pads 507 and the Au—Sn eutectic solder layer 511 are molten, even when the Au—Sn eutectic solder pads 507 and the Au—Sn eutectic solder layer 511 are made of an identical Au—Sn eutectic solder, the mounting of the submount 9 on the Cu heat-dissipation block 10 and the mounting of the GaN-based semiconductor laser chip LD1 on the submount 9 can be performed at different melting temperatures, where the melting temperature used for mounting the submount 9 on the Cu heat-dissipation block 10 is lower than the melting temperature used for mounting the GaN-based semiconductor laser chip LD1 on the submount 9. Therefore, it is unnecessary to use a low-melting-point solder. When a low-melting-point solder is used, the position of the light emission point is likely to vary with elapse of time. Thus, in order to suppress variations in the position of the light emission point, it is advantageous to make a difference in the melting point as explained above.

In addition, in the first embodiment, the GaN-based semiconductor laser chip LD1 is mounted junction-side-down on the Cu heat-dissipation block 10. That is, the GaN-based semiconductor laser chip LD1 is arranged so that a substrate is located on the upper side, and the side of the GaN-based semiconductor laser chip LD1 on which a laser structure (realized by pn junctions) is formed is located on the lower side. In this example, the substrate is made of $Al_2O_3$.

Further, the light emission point of the GaN-based semiconductor laser chip LD1 is located at the position indicated with the reference Q in FIG. 9. In addition, a groove 512 is formed in the Au—Sn eutectic solder pads 507, the Au/Pt/Ti metalization layer 506, and the Au/Ni plating layer 505, and the GaN-based semiconductor laser chip LD1 is bonded to the Cu heat-dissipation block 10 so that the groove is located immediately below a light emission region of the GaN-based semiconductor laser chip LD1. That is, the light emission region per se of the GaN-based semiconductor laser chip LD1 is not directly bonded to the submount, and therefore the stress can be further reduced. Furthermore, when the groove 512 is formed, it is possible to prevent the submount 9 from eclipsing an emitted light beam.

It is possible to form an n electrode 513a of the GaN-based semiconductor laser chip LD1 at an area which is to be opposed to the higher surface of the Au/Pt/Ti metalization layer 506, form the Au/Pt/Ti metalization layer 506 so as to insulate the thicker area and thinner areas of the Au/Pt/Ti metalization layer 506 from each other, and electrically connect the n electrode to the thicker area, and a p electrode 513b to one of the thinner areas.

In the first embodiment, the heat-dissipation block 10 is made of copper, which has high thermal conductivity and is not expensive. Therefore, the Cu heat-dissipation block 10 can effectively dissipate heat generated by the GaN-based semiconductor laser chip LD1, and can be manufactured at low cost.

In addition, in the laser-light source according to the first embodiment of the present invention, the GaN-based semiconductor laser chip LD1 is fixed to the submount 9 in a junction-side-down structure. Therefore, the light emission region of the GaN-based semiconductor laser chip LD1 is located nearer to the submount 9 and the Cu heat-dissipation block 10, compared with structures in which the substrate side of the GaN-based semiconductor laser chip LD1 is bonded to the submount 9. Therefore, in this respect, the heat is further effectively dissipated.

Further, the GaN-based semiconductor laser chip LD1 is bonded to the submount 9 with the Au—Sn eutectic solder pads 507, and the Au—Sn eutectic solder is superior in characteristics relating to locational variations with elapse of time. Therefore, in the laser-light source according to the first embodiment of the present invention, it is possible to effectively prevent the variations of the location of the light emission point with elapse of time.

Figure 11:
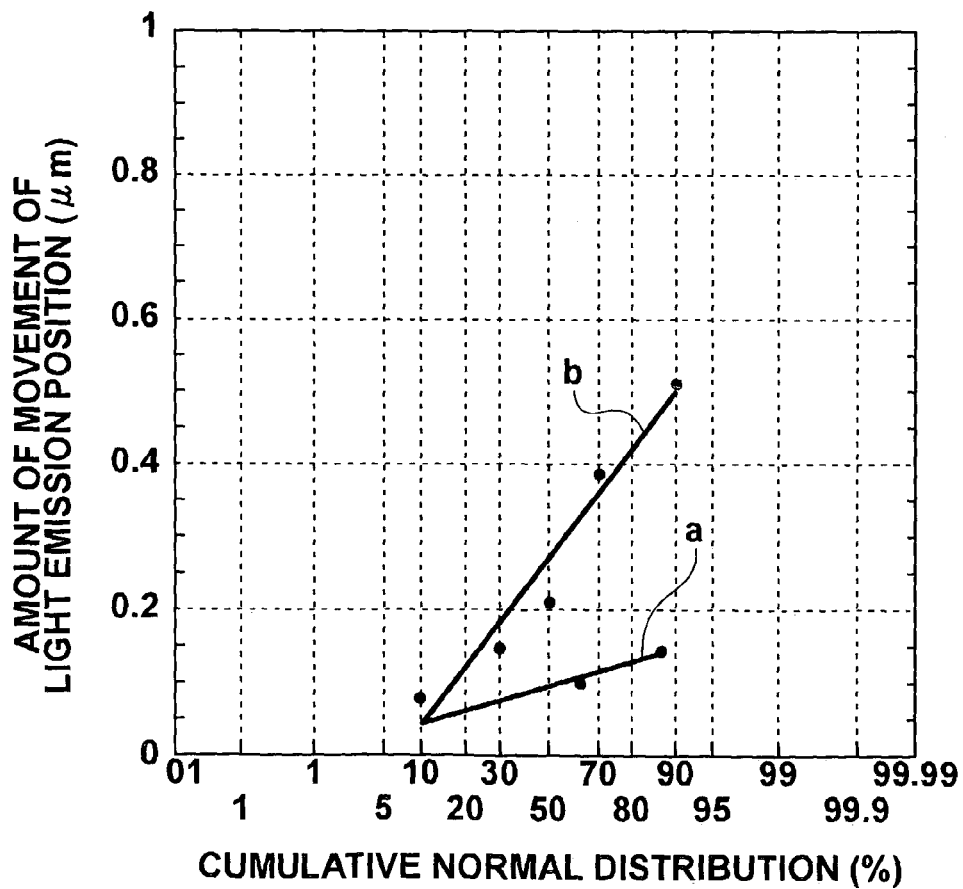
FIG. 11 is a graph indicating variations of the amount of movement of a light emission point in a semiconductor laser used in the laser-light source of FIG. 9, in comparison with variations of the amount of movement of a light emission point in a conventional semiconductor laser.

In FIG. 11, results of measurement of the amount of vertical movement of the light emission point of the GaN-based semiconductor laser chip LD1 mounted as above in aging tests performed at −40° C. to 80° C. are indicated by the reference a. In FIG. 11, the abscissa corresponds to a cumulative normal distribution (%) of the amount of vertical movement of the light emission point in cases where different solder materials are used, and the ordinate corresponds to the amount of vertical movement of the light emission point. In addition, results of measurement of the amount of vertical movement of the light emission point of the GaN-based semiconductor laser chip mounted by using the low-melting-point solder are also indicated by the reference b for comparison. As indicated in FIG. 11, the amount of vertical movement of the light emission point of the GaN-based semiconductor laser chip LD1 in the first embodiment is significantly reduced.

Figure 12:
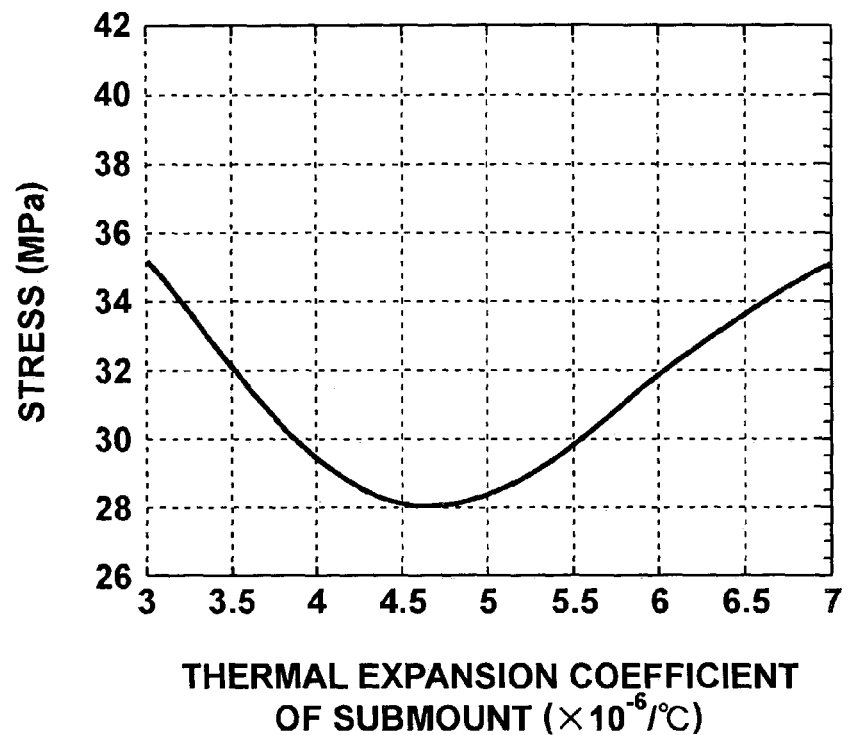
FIG. 12 is a graph indicating a relationship between the thermal expansion coefficient of a submount under the semiconductor laser used in the laser-light source of FIG. 1 and the stress exerted on the light emission point.

FIG. 12 shows a result of a computer simulation indicating how the stress caused by thermal strain and exerted on the light emission point of the mounted GaN-based semiconductor laser chip LD1 varies with the thermal expansion coefficient of the submount. In the simulation, numerical values of the thicknesses, thermal expansion coefficients, and Young's moduli of the submount 9, the Cu heat-dissipation block 10, the Au/Pt/Ti metalization layers 504, 506, and 509, the Au/Ni plating layers 505 and 508, the Au—Sn eutectic solder layers 507 and 511, and the substrate, a lower cladding layer, a light emission layer, an upper cladding layer, and an insulation film of the GaN-based semiconductor laser chip LD1, except for the thermal expansion coefficient of the AlN submount 9, were obtained and utilized.

As indicated in FIG. 12, when the thermal expansion coefficient of the submount 9 is within the range of 3.5 to $6.0 \times 10^{-6}/°$ C., the above stress becomes equal to about 32 MPa or smaller, i.e., the stress is limited within such a range that the stress does not cause a substantial problem in practical use of the GaN-based semiconductor laser chip LD1. In consideration of the above result, the submount 9 in the laser-light source according to the present invention is made of a material having a thermal expansion coefficient within the range of 3.5 to $6.0 \times 10^{-6}/°$ C.

In addition, it is preferable that the thermal expansion coefficient of the submount 9 is within the range of 4.0 to $5.4 \times 10^{-6}/°$ C., since the stress becomes about 29.5 MPa or smaller when the thermal expansion coefficient is within this range. It is more preferable that the thermal expansion coefficient of the submount 9 is within the range of 4.4 to $4.8 \times 10^{-6}/°$ C., since the stress becomes about 28 MPa when the thermal expansion coefficient is within this range. The thermal expansion coefficient of AlN, of which the submount 9 in the first embodiment is made, is $4.5 \times 10^{-6}/°$ C., which is within the most preferable range.

Figure 13:
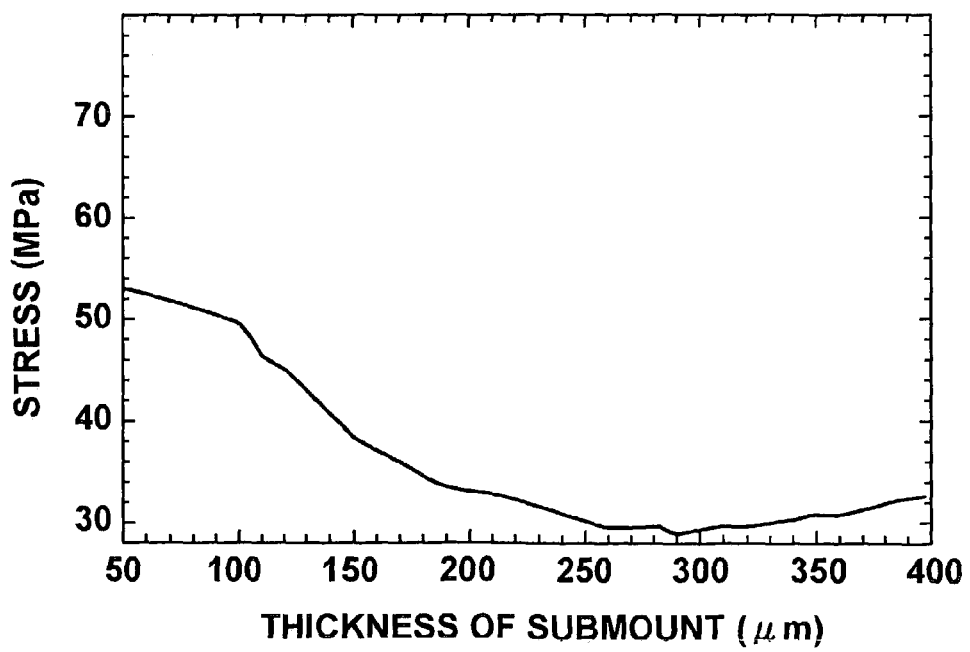
FIG. 13 is a graph indicating a relationship between the thickness of a submount under the semiconductor laser used in the laser-light source of FIG. 1 and the stress exerted on the light emission point.

FIG. 13 shows a result of a computer simulation indicating how the stress caused by thermal strain and exerted on the light emission point of the mounted GaN-based semiconductor laser chip LD1 varies with the thickness of the AlN submount 9. In this simulation, numerical values of the thicknesses, thermal expansion coefficients, and Young's moduli of the AlN submount 9, the Cu heat-dissipation block 10, the Au/Pt/Ti metalization layers 504, 506, and 509, the Au/Ni plating layers 505 and 508, the Au—Sn eutectic solder layers 507 and 511, and the substrate, the lower cladding layer, the light emission layer, the upper cladding layer, and the insulation film of the GaN-based semiconductor laser chip LD1 were obtained and utilized.

As indicated in FIG. 13, when the thickness of the AlN submount 9 is within the range of 200 to 400 micrometers, the above stress becomes equal to about 34 MPa or smaller, i.e., the stress is limited within such a range that the stress does not cause a substantial problem in practical use of the GaN-based semiconductor laser chip LD1. In consideration of the above result, the AlN submount 9 in the laser-light source according to the present invention is made of a material having a thickness within the range of 200 to 400 micrometers. In addition, it is preferable that the thickness of the AlN submount 9 is within the range of 250 to 350 micrometers, since the stress becomes about 32 MPa or smaller when the thickness is within this range.

Further, the AlN submount 9 receives great compressive stress from the Cu heat-dissipation block 10. Although the AlN submount 9 also receives compressive stress from the GaN-based semiconductor laser chip LD1, the compressive stress received from the GaN-based semiconductor laser chip LD1 is smaller than the compressive stress received from the Cu heat-dissipation block 10.

In constructions in which laser beams emitted from a plurality of semiconductor lasers are collected and coupled to a multimode optical fiber as in the laser-light source according to the present invention, the coupling efficiency decreases when the positions of the light emission points vary with elapse of time. Therefore, the decrease in the coupling efficiency can be prevented by suppressing the variations of the positions of the light emission points.

Second Embodiment

Figure 14:
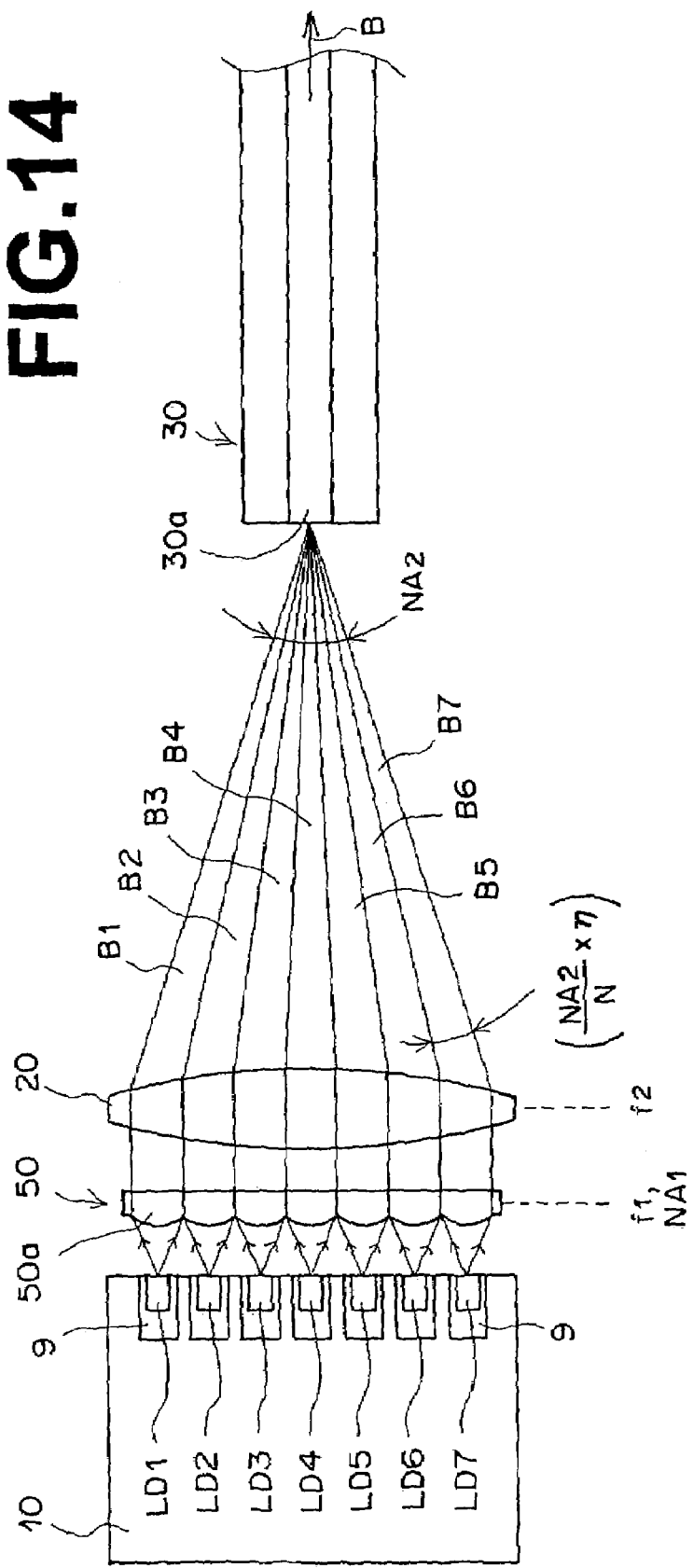
FIG. 14 is a plan view of a laser-light source as a second embodiment of the present invention.

FIG. 14 is a plan view of a laser-light source according to the second embodiment of the present invention. Elements in FIG. 14 which are respectively equivalent to elements in FIG. 1 bear the same reference numbers as the corresponding elements in FIG. 1, and explanations of the equivalent elements are not repeated here.

The laser-light source according to the second embodiment is different from the laser-light source of FIG. 1 basically in that a collimator lens array 50 comprised of seven lens elements 50a is used instead of the aforementioned seven collimator lenses 11 to 17 which are separately formed. The GaN-based semiconductor laser chips LD1 to LD7 in the second embodiment are mounted in a similar manner to the first embodiments.

In the first embodiment, it is possible to increase the space utilization efficiency by closely arranging the seven collimator lenses 11 to 17 which are separately formed, i.e., arranging the seven collimator lenses 11 to 17 with a small pitch. However, when the above collimator lens array 50 is used, the effect of increasing the space utilization efficiency can be further enhanced. When the space utilization efficiency is increased as above, it is possible to relax requirements for alignment precision in assembly of the GaN-based semiconductor laser chips LD1 to LD7, the optical condenser system, and the multimode optical fiber 30. The reason for this advantage is explained in detail below.

Assume that the focal length and the numerical aperture of each of the lens elements 50a constituting the collimator lens array 50 (or each of the collimator lenses 11 to 17 in the construction of FIG. 1) are respectively f1 and $NA_1$, the focal length of the condenser lens 20 is f2, the numerical aperture of the multimode optical fiber 30 is $NA_2$, and the space utilization efficiency is η. The space utilization efficiency η is defined as a ratio of the space occupied by the optical paths of the seven laser beams B1 to B7 to the total space between and including the laser beams B1 and B7. Therefore, when the optical paths of the seven laser beams B1 to B7 abut each other as illustrated in FIG. 14, η=1.

The magnifying power M of the lens system, i.e., the ratio of the diameter of the beam spot at the end face of the core of the multimode optical fiber 30 to the diameter of the beam spot at the light emission point of each of the GaN-based semiconductor laser chips LD1 to LD7, is expressed by the following expression (1), where N is the number of the optically multiplexed laser beams.

$$M = \frac{f_2}{f_1} = \frac{NA_1}{\frac{NA_2}{N} \times \eta} = \frac{NA_1}{NA_2} \times \frac{N}{\eta} \quad (1)$$

As understood from the equation (1), the magnifying power M decreases with increase in the space utilization efficiency η. In addition, the distances over which the laser beams B1 to B7 move on the end face of the core of the multimode optical fiber 30 when the relative misalignment between the GaN-based semiconductor laser chips LD1 to LD7, the condenser lens 20, and the multimode optical fiber 30 occurs decreases with decrease in the magnifying power M. Therefore, in the case where the space utilization efficiency η is great, the magnifying power M is small, and therefore it is possible to make the laser beams B1 to B7 normally enter the core 30a in the multimode optical fiber 30 even when the alignment precision in the assembly of the GaN-based semiconductor laser chips LD1 to LD7, the condenser lens 20, and the multimode optical fiber 30 is relatively low. When the alignment precision in the assembly can be relaxed as above, it is possible to further increase the number of optically multiplexed laser beams and the output power. Since the magnifying power M decreases when the space utilization efficiency η is increased, increase in the magnifying power M caused by the increase in the number of optically multiplexed laser beams can be compensated for, and therefore it is possible to increase the number of optically multiplexed laser beams.

Although the number of optically multiplexed laser beams in the laser-light source in each of the first and second embodiments is seven, the number of optically multiplexed laser beams may be any number greater then one. The preferable numbers of the optically multiplexed laser beams are as explained before.

In the case where a plurality of semiconductor lasers are arranged on a line and fixed on a support member such as a heat block as in the first and second embodiments and the third embodiment (which will be explained later), it is possible to form a stack of a plurality of support members on each of which a plurality of semiconductor lasers are fixed, so as to two-dimensionally arrange a great number of semiconductor lasers.

That is, in the case where a great number of semiconductor lasers are two-dimensionally arranged when viewed from the laser-receiving side, the great number of semiconductor lasers can be arranged with high density. Therefore, it is possible to make the great number of laser beams enter the multimode optical fiber and obtain an optically multiplexed laser beam with higher output power.

Third Embodiment

Figure 15:
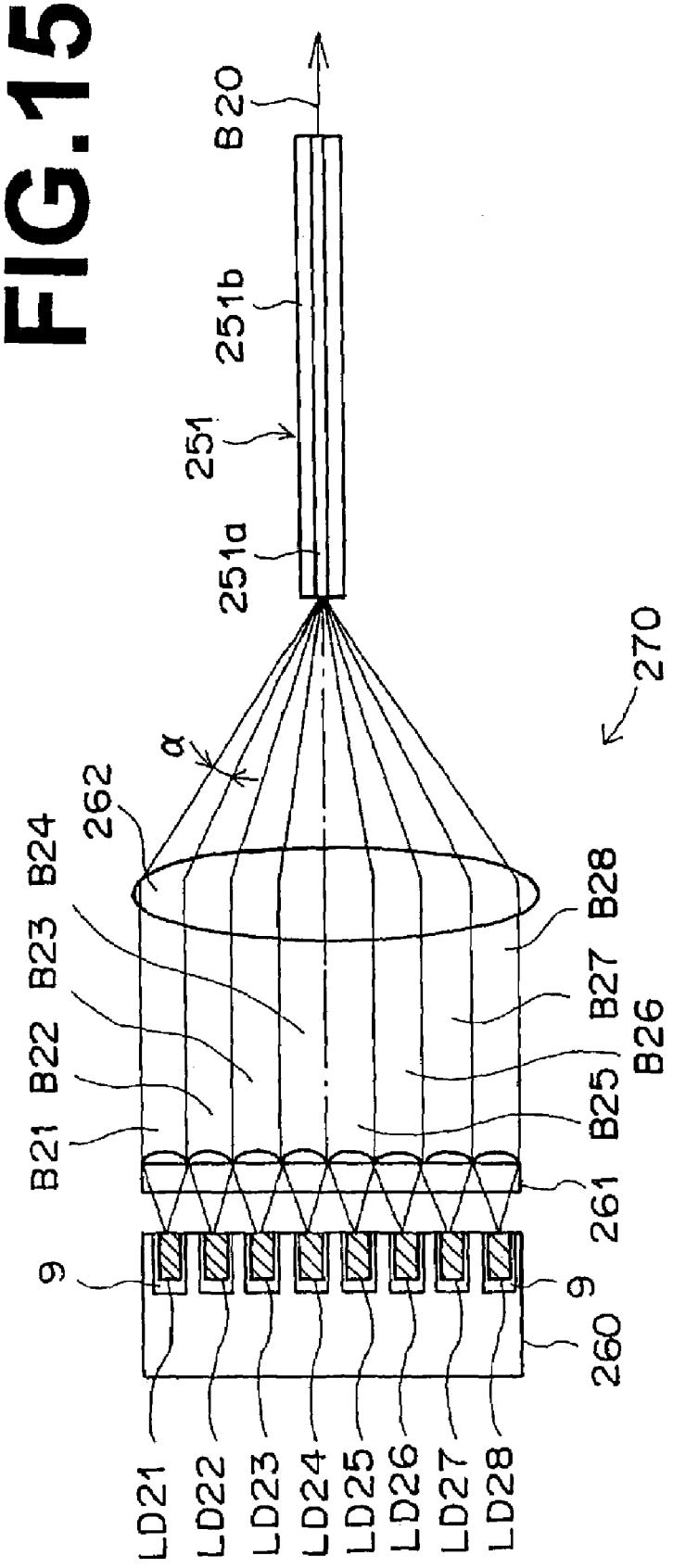
FIG. 15 is a plan view of a laser-light source as a third embodiment of the present invention.

FIG. 15 is a plan view of a laser-light source according to the third embodiment of the present invention. The laser-light source according to the third embodiment also optically multiplexes a plurality of laser beams having an identical wavelength, and comprises eight GaN-based semiconductor laser chips LD21 to LD28 and an optical multiplex system 270, where the GaN-based semiconductor laser chips LD21 to LD28 are fixed on a heat block 260 made of copper.

The GaN-based semiconductor laser chips LD21 to LD28 each have an identical oscillation wavelength of 400 nm and an identical output power of 50 mW. Divergent laser beams B21 to B28 emitted from the GaN-based semiconductor laser chips LD21 to LD28 are respectively collimated by a microlens array 261. Then, the collimated laser beams B21 to B28 are collected by a condenser lens 262, and converge on an entrance end face of the core 251a of a multimode optical fiber 251. In this example, the optical multiplex system 270 is constituted by the microlens array 261, the condenser lens 262, and the multimode optical fiber 251 comprising the core 251a and cladding 251b. Thus, the laser beams B21 to B28 collected by the condenser lens 262 as above enter and propagate in the core 251a of the multimode optical fiber 251, in which the laser beams B21 to B28 are optically multiplexed into a single laser beam B20. Then, a laser beam B20 is output from the multimode optical fiber 251.

When the numerical aperture (NA) of each lens constituting the microlens array 261 is 0.5, and the angle α of convergence of each of the collimated laser beams B21 to B28 by the condenser lens 262 is 2.75 degrees, the diameter of a convergence spot on the core 251a on which each of the collimated laser beams B21 to B28 converges becomes about 1.4 micrometers. In addition, when the output power of each of the GaN-based semiconductor laser chips LD21 to LD28 is 50 mW, the output power of the optically multiplexed laser beam B20 becomes 400 mW.

Each of the GaN-based semiconductor laser chips LD21 to LD28 in the third embodiment is also mounted on the heat block 260 through a submount 9 in a similar manner to the first embodiment.

Fourth Embodiment

Figure 16:
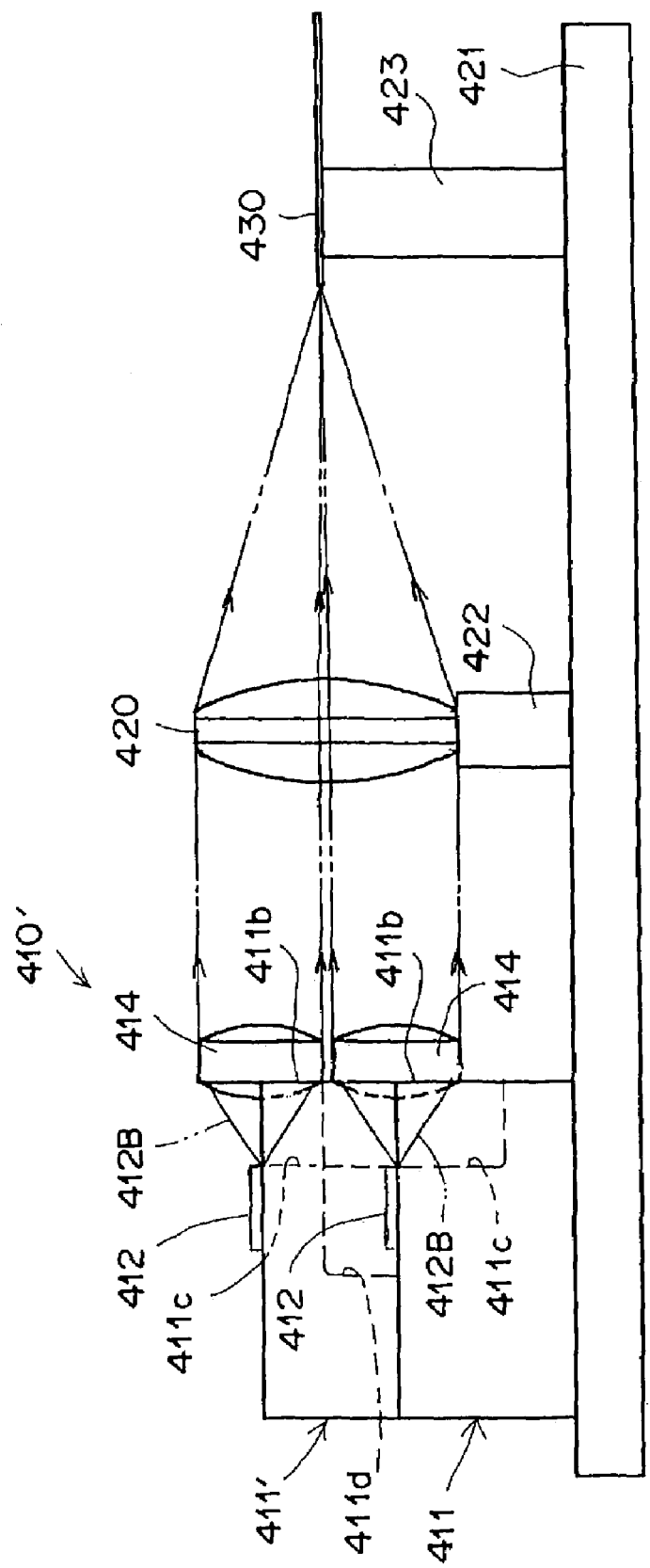
FIG. 16 is a side view of a laser apparatus as a fourth embodiment of the present invention.
Figure 17:
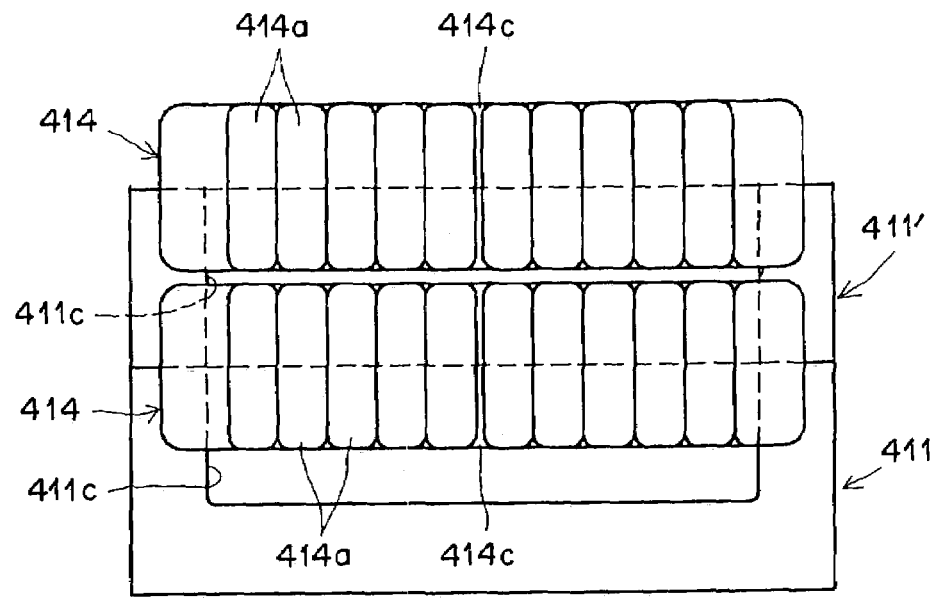
FIG. 17 is a partial front view of the laser apparatus of FIG. 16.
Figure 18:
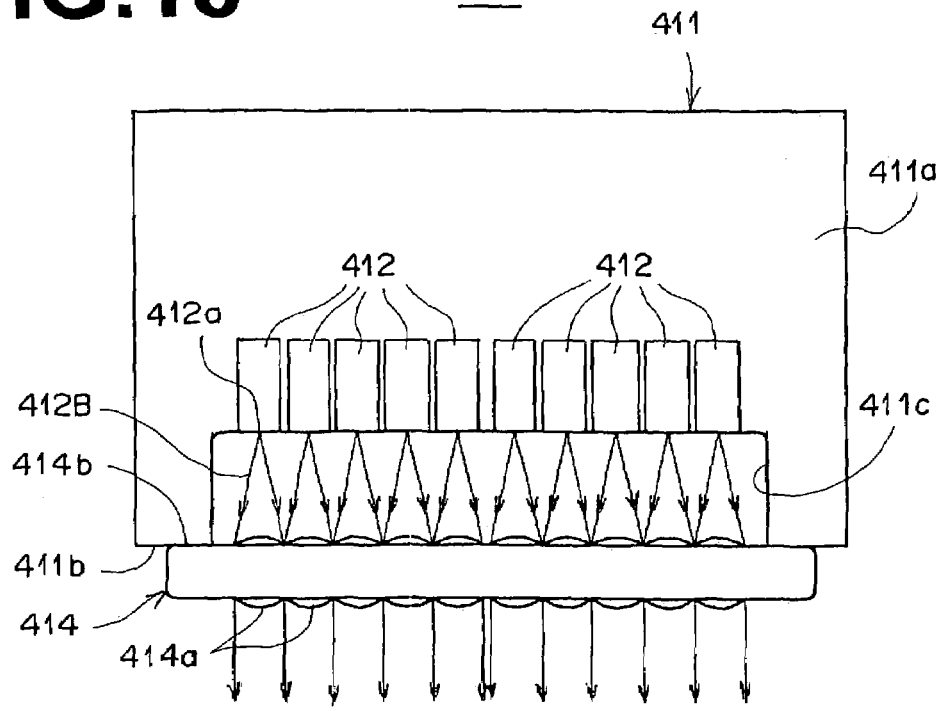
FIG. 18 is a partial plan view of the laser apparatus of FIG. 16.

A laser apparatus 410' according to the fourth embodiment of the laser-light source according to (the first aspect of) the present invention is explained below with reference to FIGS. 16, 17, and 18, which are side, partial front, and partial plan views of the laser apparatus according to the fourth embodiment.

In the laser apparatus 410', for example, twenty single-cavity laser diode chips 412 are arranged in two layers, and ten of the laser diode chips 412 are arranged in the lateral direction in each of the two layers. That is, a heat block 411' is stacked and fixed on another heat block 411, and ten of the laser diode chips 412 and a collimator lens array 414 are fixed on each of the heat blocks 411 and 411'. The collimator lens array 414 is made of synthetic resin or glass.

For example, the laser diode chips 412 have an identical oscillation wavelength of 405 nm, and emit laser beams 412B from light emission points 412a with an identical output power of 30 mW.

On the other hand, the heat block 411 comprises a laser fixation surface 411a, a lens setting surface 411b, and a concavity 411c. The laser fixation surface 411a is a horizontal surface on which the ten laser diode chips 412 are to be fixed. The lens setting surface 411b is formed on the forward side of positions at which the laser diode chips are fixed, where the forward side is a side toward which the laser beams 412B are emitted from the light emission points 412a of the laser diode chips 412. The concavity 411c is formed so as to avoid occurrence of an eclipse of the laser beams 412B which are divergent and emitted from the light emission points 412a. The heat block 411' comprises a concavity 411d arranged for avoiding interference with the laser diode chips fixed on the heat block 411 in the lower layer, as well as a laser fixation surface 411a, a lens setting surface 411b, and a concavity 411c which are respectively similar to the corresponding provisions in the heat block 411.

The laser fixation surface 411a in each of the heat blocks 411 and 411' is worked into a highly flat surface with a flatness of 0.5 micrometers or smaller. In order to ensure thermal diffusion and suppress temperature rise, the laser diode chips 412 are fixed to the laser fixation surface 411a with brazing material.

The lens setting surface 411b in each of the heat blocks 411 and 411' is formed perpendicular to the light emission axes O of the laser diode chips 412 at a predetermined distance apart from the light emission points 412a. The lens setting surface 411b is also worked into a highly flat surface with a flatness of 0.5 micrometers or smaller.

Each collimator lens array 414 is constituted by ten collimator lenses 414a which are arranged on a line and are integrally formed. Each of the collimator lenses 414a has an elongated shape obtained by cutting a portion containing an optical axis of an axially symmetric lens from the axially symmetric lens. The focal length f and the effective height of each collimator lens are respectively 0.9 mm and 1.3 mm. In addition, the length-to-width ratio of each collimator lens is, for example, 3:1.

Further, each collimator lens array 414 comprises additional portions which jut out from both ends of the collimator lens array 414. The back surfaces of the additional portions are worked into highly smoothed surfaces, which are used as end faces 414b for attachment to the heat block 411 or 411'. Thus, the collimator lens array 414 is fixed to a corresponding one of the heat blocks 411 and 411', for example, by bonding the end faces 414b to the lens setting surface 411b with an adhesive.

At the time of attachment of each collimator lens array 414 to the heat block 411 or 411', it is necessary to position the collimator lens array 414 so that the light emission axes O of the laser diode chips in the corresponding layer coincide with the optical axes of the collimator lenses 414a, respectively. In this example, each collimator lens array 414 can be easily and correctly positioned by pressing the collimator lens array 414 against the lens setting surface 411b and moving the collimator lens array 414 in the vertical and horizontal directions in a plane perpendicular to the optical axes of the collimator lens array 414.

The lens setting surface 411b and each collimator lens array 414 are configured so that the relative position between the lens setting surface 411b and each collimator lens array 414 fixed to the heat block 411 or 411' is such that the focal points of the collimator lenses 414a are respectively located at the light emission points 412a of the laser diode chips 412. Therefore, when each collimator lens array 414 is fixed to the heat block 411 or 411', the collimator lenses 414a are automatically and appropriately positioned in the direction of the optical axes. That is, the collimator lenses 414a are automatically set in such positions that the divergent laser beams 412B are correctly collimated.

Alternatively, in order to fix the collimator lens array 414 to the heat block 411 or 411', it is possible to bond other surfaces of the collimator lens array 414 and the heat block 411 or 411' together. For example, it is possible to provide a mount which juts out from the forward side of each of the heat blocks 411 and 411' (toward the right direction in FIG. 16), and bond a surface of each collimator lens array 414 parallel to the optical axes of the collimator lens array 414 (e.g., the bottom surface of the collimator lens array 414) to an upper surface of the mount.

In the fourth embodiment, the lens setting surface 411b of each of the heat blocks 411 and 411' is a highly flat surface as explained above. Therefore, it is possible to suppress the movement of the collimator lens array 414 during the operation for fixing the collimator lens array 414 to each of the heat blocks 411 and 411', and correctly position the collimator lens array 414.

In addition, the laser fixation surface 411a of each of the heat blocks 411 and 411' is also a highly flat surface as explained above. Therefore, it is possible to suppress the movement of the laser diode chips 412 during the operation for fixing the laser diode chips 412 to each of the heat blocks 411 and 411', and correctly position the laser diode chips 412.

In the laser apparatus 410' according to the fourth embodiment, the plurality of laser beams 412B are optically multiplexed into a single laser beam having high intensity. As illustrated in FIG. 16, the heat block 411 in the laser apparatus 410' is fixed on a base plate 421. In addition, a condenser-lens holder 422 for holding a condenser lens 420 and a fiber holder 423 for holding the entrance end of a multimode optical fiber 430 are fixed to the base plate 421.

In the above construction, the ten laser beams 412B collimated by the respective collimator lenses 414a in the collimator lens array 414 in each layer are collected by the condenser lens 420, and converge on a light-entrance end face of a core (not shown) of the multimode optical fiber 430. Then, the twenty collimated laser beams 412B in total enter the core of the multimode optical fiber 430, and are optically multiplexed into a single laser beam. Thus, the optically multiplexed laser beam is output from the multimode optical fiber 430. The multimode optical fiber 430 may be a step-index type, a step-index type, or any combination thereof.

In the above example, the condenser lens 420 is a lens having a width of 6 mm, an effective height of 1.8 mm, and a focal length of 14 mm. The multimode optical fiber 430 has a core diameter of 50 micrometers and a numerical aperture (NA) of 0.2. The twenty laser beams 412B are collected by the condenser lens 420, and converge on the end face of the core of the multimode optical fiber 430 with a convergence spot diameter of about 30 micrometers. The sum of the loss of the laser beams 412B in the fiber coupling and the loss of the laser beams 412B during the transmission through the collimator lenses 414a and the condenser lens 420 is 20%. Thus, when the output power of each of the laser beams 412B is 30 mW, the output power of the optically multiplexed laser beam becomes 480 mW, i.e., a high-power, high-intensity laser beam is obtained.

Further, when laser diode chips 412 are stacked in three layers in each of which ten laser diode chips are arranged, it is possible to obtain a high-intensity optically multiplexed laser beam with an output power of 720 mW.

Image Exposure System

Next, an image exposure system using the high-intensity ultraviolet-light optically-multiplexing fiber module illustrated in FIGS. 3 to 5 is explained with reference to FIGS. 19 to 23.

Figure 19:
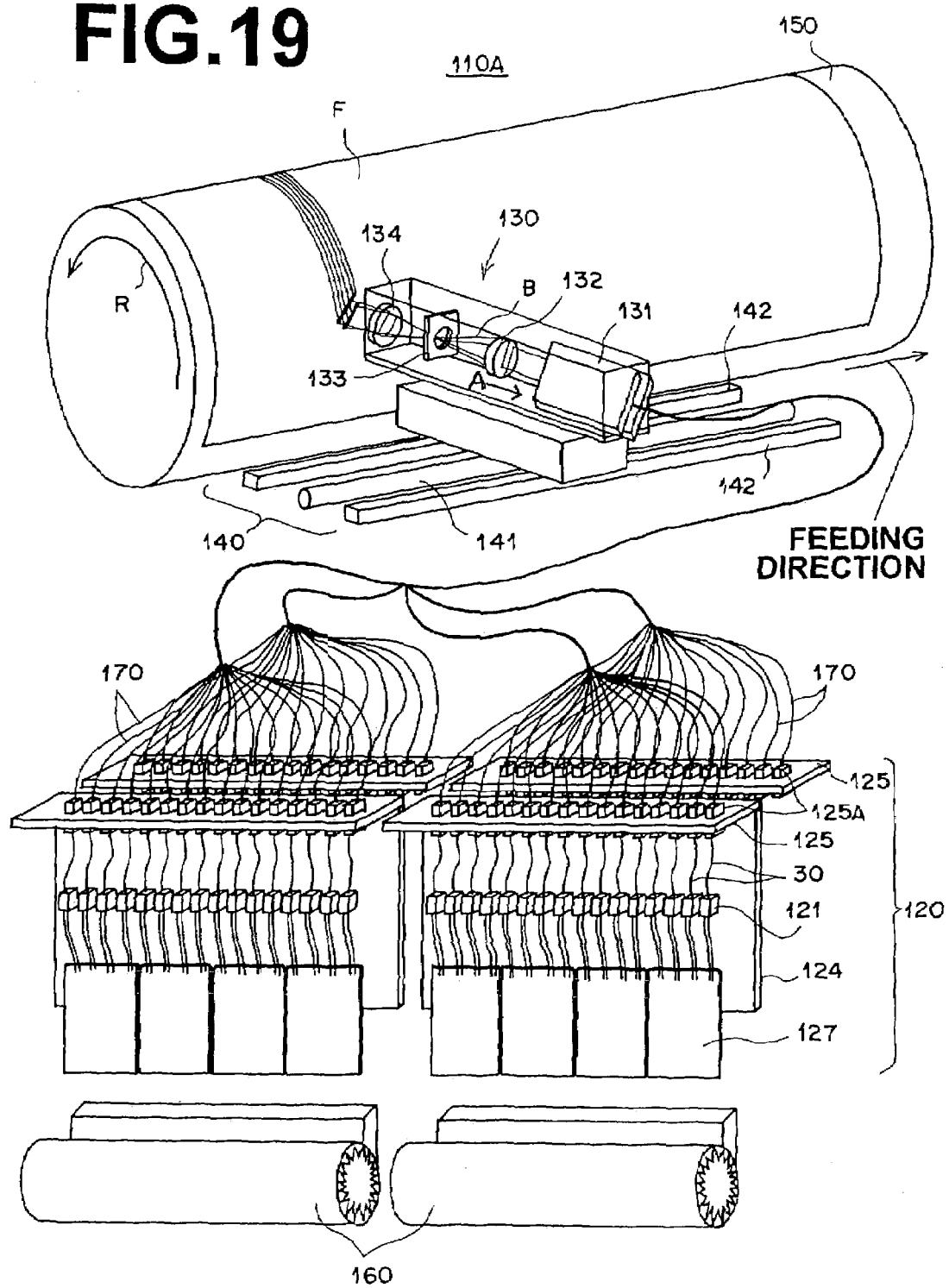
FIG. 19 is a perspective view of an image exposure system as an embodiment of the second aspect of the present invention.

FIG. 19 shows an entire construction of an image exposure system 110A. As illustrated in FIG. 19, the image exposure system 110A comprises a light source unit 120, an exposure head 130, an exposure-head movement unit 140, a drum 150, and a cooling blower 160. The light source unit 120 generates a plurality of laser beams. The exposure head 130 collects the plurality of laser beams generated by the light source unit 120. The exposure-head movement unit 140 moves the exposure head 130 in the feeding direction. A recording medium F in which an image is to be recorded is placed around the drum 150, and the drum 150 is rotationally driven in the direction indicated by the arrow R in FIG. 19 so that the recording medium F moves in the main scanning direction. The cooling blower 160 produces wind (cooling wind) for cooling mainly the light source unit 120.

The recording medium F is a flexible recording material which can be placed around the drum 150. Specifically, the recording medium F is a photosensitive or thermosensitive film, a photosensitive or thermosensitive plate for printing, or the like. Alternatively, the present invention can also be applied to an arrangement in which the drum 150 itself is photosensitive or thermosensitive, and no recording medium F is placed around the drum 150.

Figure 20:
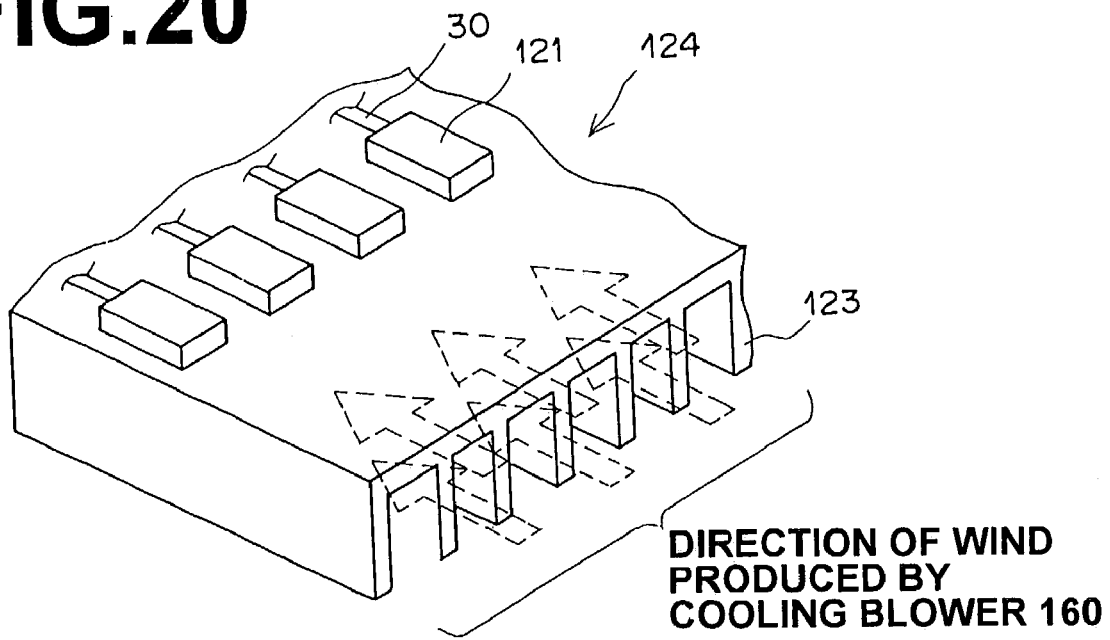
FIG. 20 is a perspective view of a portion of the image exposure system of FIG. 19.

The light source unit 120 comprises a light-source board 124, an adapter board 125, and an LD-driver board 127. A plurality of optically-multiplexing fiber modules 121 are arranged on the front side of the light-source board 124, and heat-dissipation fins 123 are arranged on the back surface of the light-source board 124, as illustrated in FIG. 20, which is a perspective view of a portion of the image exposure system of FIG. 19. Each of the optically-multiplexing fiber modules 121 has the construction illustrated in FIGS. 3 to 5, and emits high-intensity ultraviolet laser light.

The adapter board 125 is attached to one end of the light-source board 124 so that the adapter board 125 is arranged perpendicular to the light-source board 124, and a plurality of adapters for SC optical connectors 125A are arranged on the adapter board 125, where the number of the plurality of adapters is identical to the number of the plurality of optically-multiplexing fiber modules 121. The LD-driver board 127 is attached to the other end of the light-source board 124 so that the LD-driver board 127 is arranged parallel to the light-source board 124. An LD driver circuit 126 (indicated in FIG. 22) which drives the plurality of optically-multiplexing fiber modules 121 according to image data representing the image to be recorded in the recording medium F is mounted on the LD-driver board 127.

Ends of a plurality of multimode optical fibers 30 located on one side are respectively connected to the plurality of optically-multiplexing fiber modules 121, and first plugs for the SC optical connectors 125A are arranged at the other ends of the plurality of multimode optical fibers 30 on the opposite side. The first plugs are inserted into jacks provided on a first side of the plurality of adapters on the adapter board 125. Therefore, laser beams emitted from the plurality of optically-multiplexing fiber modules 121 are transmitted through the plurality of multimode optical fibers 30 to approximately the center positions of the plurality of adapters on the adapter board 125.

The LD driver circuit 126 on the LD-driver board 127 has output terminals for signals which drive the plurality of optically-multiplexing fiber modules 121, and the output terminals are respectively connected to the corresponding optically-multiplexing fiber modules 121. Thus, the operations of the plurality of optically-multiplexing fiber modules 121 are individually controlled by the LD driver circuit 126.

In the exposure head 130, a fiber array unit 131 is arranged. The fiber array unit 131 collects the laser beams B emitted from the plurality of optically-multiplexing fiber modules 121, and emits the collected laser beams. The laser beams are transmitted from the plurality of optically-multiplexing fiber modules 121 to the fiber array unit 131 through a plurality of multimode optical fibers 170. Second plugs for the SC optical connectors are provided at first ends of the plurality of multimode optical fibers 170 located on one side, and the second plugs are inserted into jacks provided on a second side of the plurality of adapters on the adapter board 125.

Figure 21:
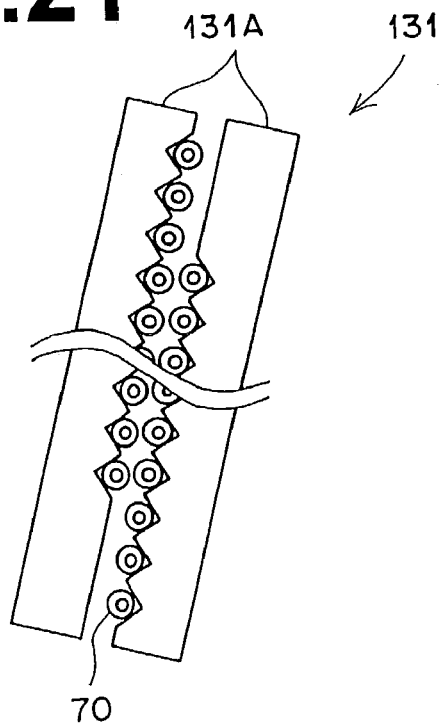
FIG. 21 is a front view of a portion of the image exposure system of FIG. 19.

FIG. 21 shows the fiber array unit 131 viewed from the direction indicated by the arrow A of FIG. 19. As illustrated in FIG. 21, the fiber array unit 131 is constituted by a pair of bases 131A. A plurality of V-grooves are formed on one side of each of the pair of bases 131A at predetermined intervals, and the pair of bases 131A are arranged so that the sides on which the V-grooves are formed are opposed to each other. The total number of the V-grooves formed on the pair of bases 131A is the number of the plurality of optically-multiplexing fiber modules 121, and each of second ends of the multimode optical fibers 170 is set in one of the V-grooves. Thus, the plurality of laser beams emitted from the respective optically-multiplexing fiber modules 121 can concurrently outgo from the second ends of the multimode optical fibers 170 positioned at the predetermined intervals in the fiber array unit 131.

In addition, as illustrated in FIG. 19, in the exposure head 130, a collimator lens 132, an aperture element 133, and an image-forming lens 134 are arranged in this order following the fiber array unit 131. The aperture element 133 is arranged so that an aperture in the aperture element 133 is located at a far field position when viewed from the laser-beam exit ends of the multimode optical fibers 170 in the fiber array unit 131. Thus, it is possible to equally exert a light-amount limitation effect on all of the laser beams B emitted from the laser-beam exit ends of the multimode optical fibers 170 in the fiber array unit 131.

On the other hand, the exposure-head movement unit 140 comprises a ball screw 141 and two rails 142 which are arranged in the feeding direction. The exposure head 130 is engaged with a portion of the ball screw 141, which is rotationally driven by a feeding motor 143 (indicated in FIG. 22). Thus, it is possible to move the exposure head 130 in the feeding direction along the rails 142 by activating the feeding motor 143.

When a main scanning motor 151 (indicated in FIG. 22) is activated, the drum 150 is rotationally driven in the direction indicated by the arrow R in FIG. 19. Thus, the main scanning is realized.

As illustrated in FIGS. 19 and 20, the cooling blower 160 is oriented so that the cooling wind produced by the cooling blower 160 blows on the heat-dissipation fins 123 in the light-source board 124 and all of the multimode optical fibers 30. Therefore, the cooling wind produced by the cooling blower 160 can suppress temperature rise during operation of the optically-multiplexing fiber modules 121, and can forcedly vibrate the respective multimode optical fibers 30.

Figure 22:
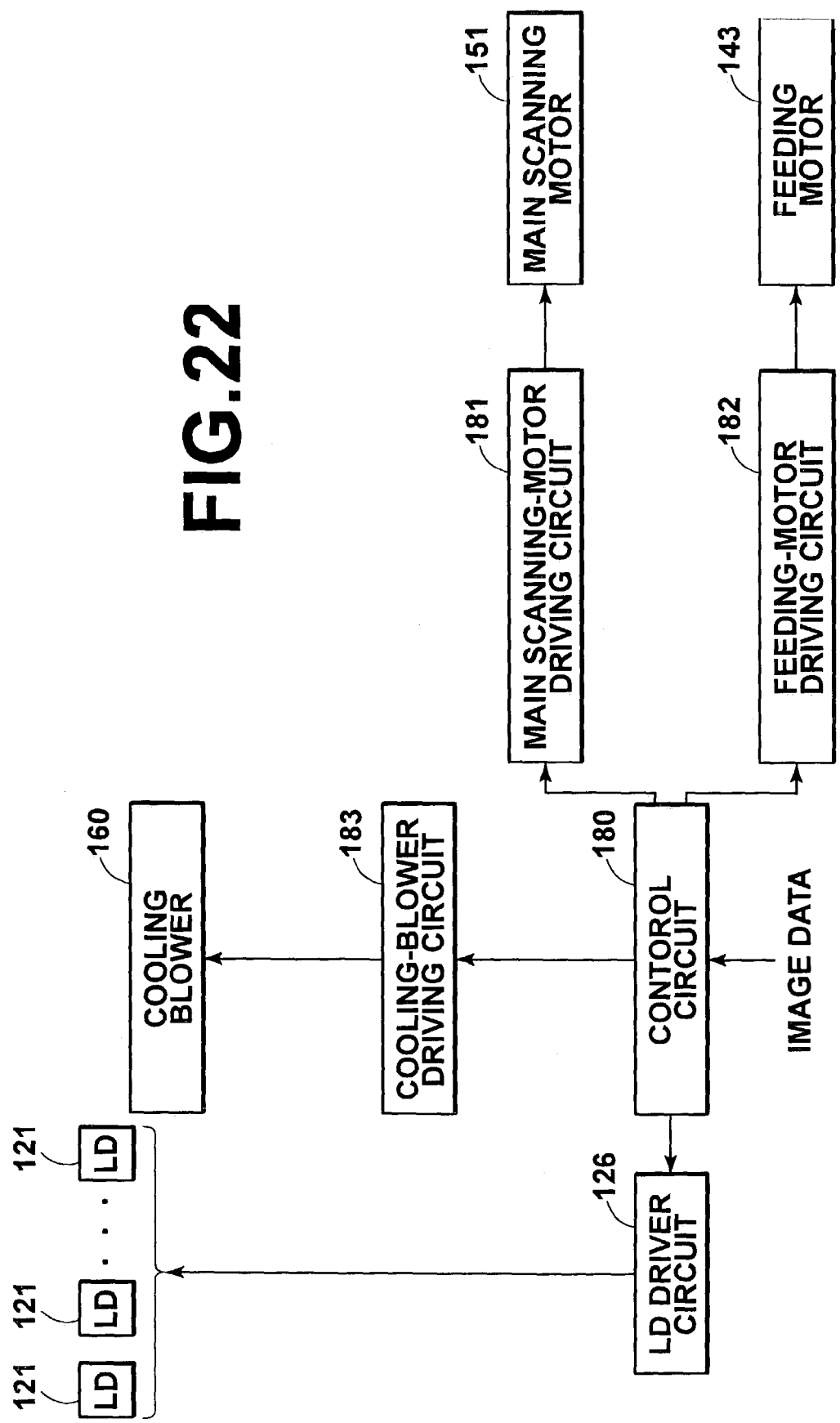
FIG. 22 is a block diagram illustrating a control system for electrically controlling the image exposure system of FIG. 19.

Next, a construction of a control system for the image exposure system 110A is explained with reference to FIG. 22. As illustrated in FIG. 22, the control system comprises the LD driver circuit 126, a main-scanning-motor driving circuit 181, a feeding-motor driving circuit 182, a cooling-blower driving circuit 183, and a control circuit 180. The LD driver circuit 126 drives the optically-multiplexing fiber modules 121 according to the image data to be recorded in the recording medium F. The main-scanning-motor driving circuit 181 drives the main scanning motor 151. The feeding-motor driving circuit 182 drives the feeding motor 143. The cooling-blower driving circuit 183 drives the cooling blower 160. The control circuit 180 controls the LD driver circuit 126, the main-scanning-motor driving circuit 181, the feeding-motor driving circuit 182, and the cooling-blower driving circuit 183. The image data to be recorded in the recording medium F is supplied to the control circuit 180.

Figure 23:
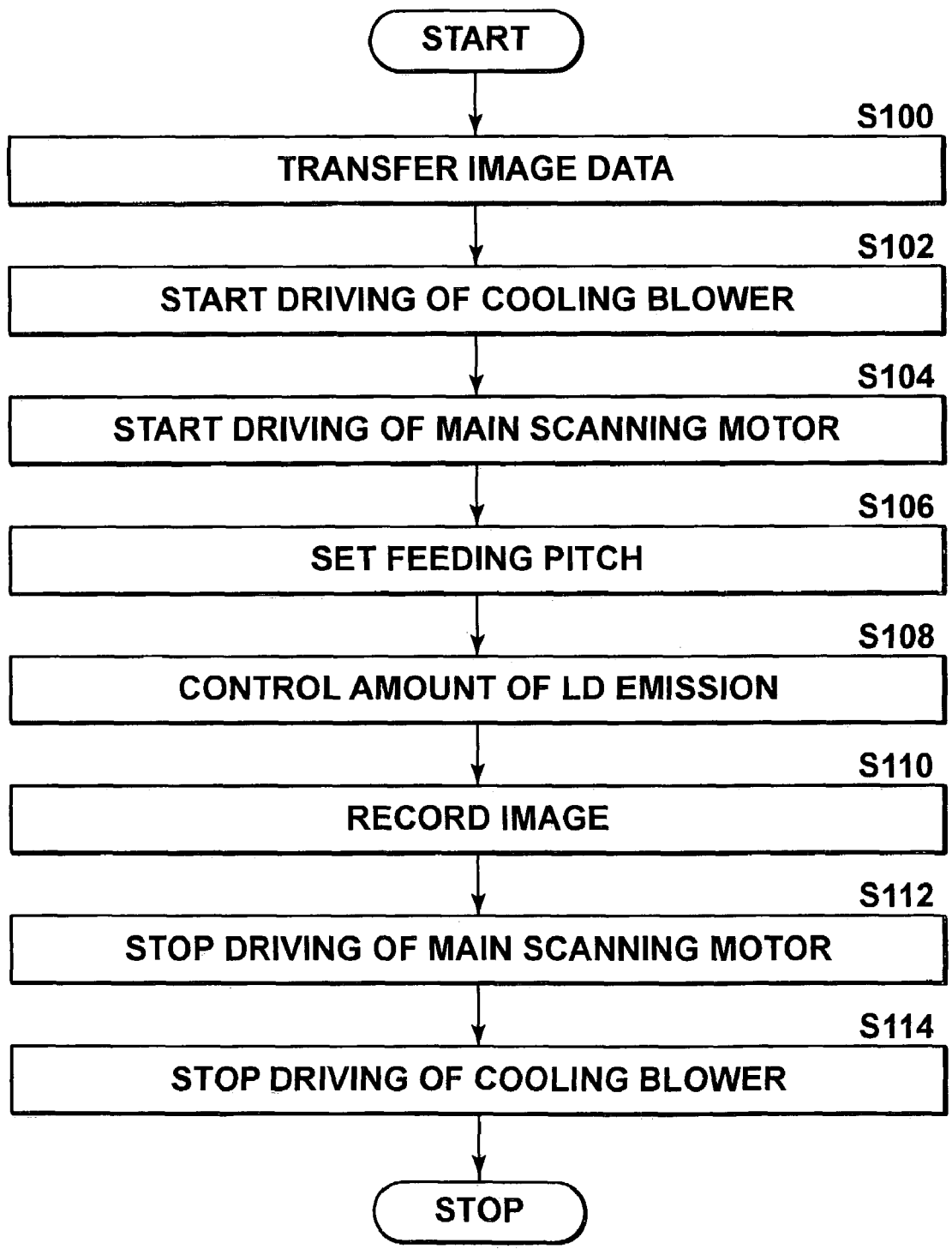
FIG. 23 is a flow diagram indicating a sequence of processing for image exposure.

Hereinbelow, the operations of the image exposure system 110A are explained with reference to FIG. 23, which is a flow diagram indicating a sequence of processing performed when the image exposure system 110A records an image.

First, in step S100, image data representing an image to be recorded in the recording medium F is transferred from an image memory (not shown) to the control circuit 180, where the image memory is provided for temporarily storing image data representing an image to be recorded. The control circuit 180 supplies signals which are adjusted based on the transferred image data and resolution data, to the LD driver circuit 126, the main-scanning-motor driving circuit 181, and the feeding-motor driving circuit 182, where the resolution data indicates a resolution predetermined for the image to be recorded.

Then, in step S102, the control circuit 180 controls the cooling-blower driving circuit 183 so as to start the operation of the cooling blower 160. Thus, the operation for cooling the optically-multiplexing fiber modules 121 with the cooling wind produced by the cooling blower 160, and the vibration of the multimode optical fibers 30 are started.

At this time, it is possible to reduce unevenness of the image recorded in the recording medium F when the vibrations of the multimode optical fibers 30 can randomize variations in the amount of light emitted from the multimode optical fibers 30. Therefore, in this embodiment, an air flow rate which can cause the above vibrations and is sufficient for cooling the heat-dissipation fins 123 is predetermined based on an experiment, a computer simulation, or the like, and the cooling-blower driving circuit 183 controls the operation of the cooling blower 160 so that the predetermined air flow rate is realized.

Next, in step S104, the main-scanning-motor driving circuit 181 controls the main scanning motor 151 based on one of the signals supplied from the control circuit 180, so that the drum 150 rotates in the direction indicated by the arrow R of FIG. 19 at a rotation speed corresponding to the resolution data. Then, in step S106, the feeding-motor driving circuit 182 sets a feeding pitch based on the resolution data, so that the exposure head 130 is moved in the feeding direction by the feeding motor 143 with the feeding pitch.

Subsequently, in step S108, the LD driver circuit 126 controls the operation of the optically-multiplexing fiber modules 121 according to the image data.

The plurality of laser beams B emitted from the optically-multiplexing fiber modules 121 pass through the multimode optical fibers 30, the SC optical connectors 125A, and the multimode optical fibers 170, and outgo from the fiber array unit 131. Then, the laser beams B are collimated by the collimator lens 132, and the light amounts of the laser beams B are limited by the aperture element 133. Finally, the laser beams B pass through the image-forming lens 134, and converge on the recording medium F on the drum 150.

In the above case, a plurality of beam spots corresponding to the plurality of laser beams B are formed on the recording medium F. When the exposure head 130 is fed in the feeding direction at the feeding pitch set in step S106, and the drum 150 rotates under the control started in step S104, the above beam spots expose the recording medium F in step S110 so as to record a two-dimensional image on the recording medium F with the resolution indicated by the resolution data.

When the recording of the two-dimensional image on the recording medium F is completed, the main-scanning-motor driving circuit 181 stops the rotational driving of the main scanning motor 151 in step S112, and the control circuit 180 controls the cooling-blower driving circuit 183 so as to stop the driving of the cooling blower 160 in step S114. Thus, the processing of FIG. 23 is completed.

According to the above processing, a two-dimensional image can be recorded on the recording medium F with a predetermined resolution, and the cooling blower 160 is driven during the image recording operation so that the multimode optical fibers 30 are randomly vibrated, and noise similar to the white noise can be superimposed on the laser beams propagated through the multimode optical fibers 30. Thus, it is possible to prevent occurrence of unevenness (such as swath-type or beat-type unevenness) of the recorded two-dimensional image.

In addition, all of the contents of the Japanese patent application No. 2002-201904 are incorporated into this specification by reference.

What is claimed is:

1. A laser-light source comprising:
   a heat-dissipation block made of copper or copper alloy;
   a plurality of submounts which are made of a material having a thermal expansion coefficient of 3.5 to 6.0× 10−6/,C, have a thickness of 200 to 400 micrometers, and are separately formed on said heat-dissipation block;
   a plurality of semiconductor lasers each of which is made of a nitride compound, has a single cavity and a form of a chip, and is mounted junction-side-down on one of said plurality of submounts;
   a multimode optical fiber; and
   an optical condenser system which collects laser beams emitted from said plurality of semiconductor lasers, and couples the collected laser beams to said multimode optical fiber;
   wherein each of said plurality of semiconductor lasers and said plurality of submounts has a bonding surface, and the bonding surface of each of the plurality of semiconductor lasers is bonded to the bonding surface of one of the plurality of submounts through a metalization layer and an Au—Sn eutectic solder layer each of which is divided into a plurality of areas.

2. A laser-light source according to claim 1, wherein each of said plurality of semiconductor lasers contains a light emission region, and said metalization layer and said Au—Sn eutectic solder layer are separated by a groove which is arranged immediately below the light emission region.

3. A laser-light source according to claim 1, wherein said plurality of submounts are made of AlN.

4. A laser-light source according to claim 1, wherein said plurality of submounts are bonded to the heat-dissipation block with Au—Sn eutectic solder.

5. A laser-light source according to claim 1, wherein said plurality of semiconductor lasers respectively contain active layers and light emission points, the light emission points of the plurality of semiconductor lasers are arranged on a line parallel to the active layers, said optical condenser system includes a plurality of collimator lenses and a condenser lens, said plurality of collimator lenses are arranged in correspondence with the plurality of semiconductor lasers and respectively collimate said laser beams emitted from the plurality of semiconductor lasers, said condenser lens collects the laser beams collimated by the plurality of collimator lenses, and makes the collimated laser beams converge on an end face of said multimode optical fiber, and said plurality of collimator lenses each have an aperture which has a first diameter parallel to said line and a second diameter perpendicular to said line and greater than the first diameter.

6. A laser-light source according to claim 5, wherein said plurality of collimator lenses are integrally formed into a lens array.

7. A laser-light source according to claim 1, wherein said heat-dissipation block is constituted by a plurality of blocks which are joined.

8. A laser-light source according to claim 1, wherein each of said plurality of semiconductor lasers is a GaN-based compound semiconductor laser.

9. A laser-light source according to claim 1, wherein said multimode optical fiber has a core diameter not greater than 50 micrometers and a numerical aperture not greater than 0.3.

10. A laser-light source according to claim 1, wherein said multimode optical fiber has a core diameter and a numerical aperture, and the core diameter multiplied by the numerical aperture is not greater than 10 micrometers.

11. A laser-light source according to claim 1, wherein said plurality of semiconductor lasers are arranged on a line, and the number of the plurality of semiconductor lasers is three to ten.

12. A laser-light source according to claim 11, wherein said plurality of semiconductor lasers are arranged on a line, and the number of the plurality of semiconductor lasers is six or seven.

13. A laser-light source according to claim 1, wherein each of said plurality of semiconductor lasers has an emission width of 1.5 to 5 micrometers.

14. A laser-light source according to claim 13, wherein each of said plurality of semiconductor lasers has an emission width of 2 to 3 micrometers.

15. A laser-light source according to claim 1, wherein said plurality of semiconductor lasers are fixed so that the plurality of semiconductor lasers are two-dimensionally arranged when viewed from a laser-receiving side.

16. A laser-light source according to claim 1, wherein each of said plurality of semiconductor lasers has a separate bonding surface with each of said plurality of mounts.

17. A laser-light source according to claim 1, wherein said metalization layer comprises a metalization layer area of greater thickness and a metalization layer area of smaller thickness, whereby the metalization layer area of greater thickness is physically separate from the metalization layer area of smaller thickness.

18. A laser-light source according to claim 1, wherein said metalization layer has a top side, whereby said top side has a steplike shape.

19. A laser-light source comprising a plurality of laser-light-source portions each of which includes:
a heat-dissipation block made of copper or copper alloy;
a plurality of submounts which are made of a material having a thermal expansion coefficient of 3.5 to 6.0× 10−6/,C, have a thickness of 200 to 400 micrometers, and are separately formed on said heat-dissipation block; a plurality of semiconductor lasers each of and a form of a chip, and is mounted junction-side-down on one of said plurality of submounts;
a multimode optical fiber; and
an optical condenser system which collects laser beams emitted from said plurality of semiconductor lasers, and couples the collected laser beams to said multimode optical fiber;
which is made of a nitride compound, has a single cavity wherein each of said plurality of semiconductor lasers and said plurality of submounts has a bonding surface, the bonding surface of each of the plurality of semiconductor lasers is bonded to the bonding surface of one of the plurality of submounts through a metalization layer and an Au—Sn eutectic solder layer each of which is divided into a plurality of areas, and said multimode optical fiber in the plurality of laser-light-source portions is arranged to constitute a one-dimensional array at least at a light-emission end of the multimode optical fiber.

20. A laser-light source comprising a plurality of laser-light-source portions each of which includes:
a heat-dissipation block made of copper or copper alloy;
a plurality of submounts which are made of a material having a thermal expansion coefficient of 3.5 to 6.0× 10−6/° C, have a thickness of 200 to 400 micrometers, and are separately formed on said heat-dissipation block;
a plurality of semiconductor lasers each of which is made of a nitride compound, has a single cavity and a form of a chip, and is mounted junction-side-down on one of said plurality of submounts;
a multimode optical fiber; and
an optical condenser system which collects laser beams emitted from said plurality of semiconductor lasers, and couples the collected laser beams to said multimode optical fiber;
wherein each of said plurality of semiconductor lasers and said plurality of submounts has a bonding surface, the bonding surface of each of the plurality of semiconductor lasers is bonded to the bonding surface of one of the plurality of submounts through a metalization layer and an Au—Sn eutectic solder layer each of which is divided into a plurality of areas, and said multimode optical fiber in the plurality of laser-light-source portions is arranged to constitute a bundle at least at a light-emission end of the multimode optical fiber.

21. An exposure system comprising a plurality of laser-light sources each of which is provided for exposure and includes:
a heat-dissipation block made of copper or copper alloy;
a plurality of submounts which are made of a material having a thermal expansion coefficient of 3.5 to 6.0×

$10-6/°$ C., have a thickness of 200 to 400 micrometers, and are separately formed on said heat-dissipation block;

a plurality of semiconductor lasers each of which is made of a nitride compound, has a single cavity and a form of a chip, and is mounted junction-side-down on one of said plurality of submounts;

a multimode optical fiber; and an optical condenser system which collects laser beams emitted from said plurality of semiconductor lasers, and couples the collected laser beams to said multimode optical fiber;

wherein each of said plurality of semiconductor lasers and said plurality of submounts has a bonding surface, the bonding surface of each of the plurality of semiconductor lasers is bonded to the bonding surface of one of the plurality of submounts through a metalization layer and an Au—Sn eutectic solder layer each of which is divided into a plurality of areas, and said multimode optical fiber in the plurality of laser-light sources is arranged to constitute a one-dimensional array at least at a light-emission end of the multimode optical fiber.

22. An exposure system comprising a plurality of laser-light sources each of which is provided for exposure and includes:

a heat-dissipation block made of copper or copper alloy;

a plurality of submounts which are made of a material having a thermal expansion coefficient of 3.5 to $6.0\times 10-6/$,C, have a thickness of 200 to 400 micrometers, and are separately formed on said heat-dissipation block; a plurality of semiconductor lasers each of which is made of a nitride compound, has a single cavity and a form of a chip, and is mounted junction-side-down on one of said plurality of submounts;

a multimode optical fiber; and an optical condenser system which collects laser beams emitted from said plurality of semiconductor lasers, and couples the collected laser beams to said multimode optical fiber; wherein each of said plurality of semiconductor lasers and said plurality of submounts has a bonding surface, the bonding surface of each of the plurality of semiconductor lasers is bonded to the bonding surface of one of the plurality of submounts through a metalization layer and an Au—Sn eutectic solder layer each of which is divided into a plurality of areas, and said multimode optical fiber in the plurality of laser-light sources is arranged to constitute a bundle at least at a light-emission end of the multimode optical fiber.

* * * * *